(12) United States Patent
Dunga et al.

(10) Patent No.: US 10,825,827 B2
(45) Date of Patent: Nov. 3, 2020

(54) NON-VOLATILE MEMORY WITH POOL CAPACITOR

(71) Applicant: SANDISK TECHNOLOGIES LLC, Addison, TX (US)

(72) Inventors: Mohan Dunga, Santa Clara, CA (US); James Kai, Santa Clara, CA (US); Venkatesh P. Ramachandra, San Jose, CA (US); Piyush Dak, San Jose, CA (US); Luisa Lin, Redwood City, CA (US); Masaaki Higashitani, Cupertino, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/141,149

(22) Filed: Sep. 25, 2018

(65) Prior Publication Data
US 2020/0013795 A1 Jan. 9, 2020

Related U.S. Application Data

(60) Provisional application No. 62/694,271, filed on Jul. 5, 2018.

(51) Int. Cl.
| | | |
|---|---|---|
| *H01L 21/00* | (2006.01) | |
| *H01L 27/11582* | (2017.01) | |
| *H01L 27/11573* | (2017.01) | |
| *G11C 7/10* | (2006.01) | |
| *G11C 16/10* | (2006.01) | |
| *G11C 16/28* | (2006.01) | |
| *H01L 27/1157* | (2017.01) | |

(52) U.S. Cl.
CPC ...... *H01L 27/11582* (2013.01); *G11C 7/1048* (2013.01); *G11C 16/10* (2013.01); *G11C 16/28* (2013.01); *H01L 27/1157* (2013.01); *H01L 27/11573* (2013.01)

(58) Field of Classification Search
CPC .. H01L 27/11582; G11C 16/28; G11C 7/1048
See application file for complete search history.

(56) References Cited

U.S. PATENT DOCUMENTS

| | | | |
|---|---|---|---|
| 4,875,083 A | 10/1989 | Palmour | |
| 5,978,271 A | 11/1999 | Sato | |
| 7,586,363 B2 * | 9/2009 | Pan | G11C 5/145 327/534 |
| 7,898,013 B2 * | 3/2011 | Cheung | H01L 27/0811 257/296 |

(Continued)

FOREIGN PATENT DOCUMENTS

| | | | | |
|---|---|---|---|---|
| WO | WO-2020009754 A1 * | 1/2020 | ......... | G11C 16/0483 |
| WO | WO-2020009755 A1 * | 1/2020 | ............. | G11C 5/025 |

OTHER PUBLICATIONS

PCT International Search Report dated Sep. 18, 2019, PCT Patent Application No. PCT/US2019/033905.

(Continued)

*Primary Examiner* — Laura M Menz
(74) *Attorney, Agent, or Firm* — Vierra Magen Marcus LLP

(57) ABSTRACT

A non-volatile storage apparatus comprises a non-volatile memory structure and an I/O interface. A portion of the memory die is used as a pool capacitor for the I/O interface.

20 Claims, 24 Drawing Sheets

(56) References Cited

U.S. PATENT DOCUMENTS

| | | | |
|---|---|---|---|
| 8,643,142 B2 | 2/2014 | Higashitani | |
| 8,804,430 B2 | 8/2014 | Lai | |
| 8,951,859 B2 | 2/2015 | Higashitani | |
| 9,208,895 B1* | 12/2015 | Huynh | G11C 16/24 |
| 9,343,165 B2* | 5/2016 | Vaysman | G06F 13/4086 |
| 9,553,506 B1* | 1/2017 | Huynh | H02M 3/07 |
| 9,779,832 B1 | 10/2017 | Masuduzzaman | |
| 10,037,810 B1* | 7/2018 | Shukla | G11C 16/08 |
| 10,134,728 B2* | 11/2018 | Mathur | H01L 27/0292 |
| 10,163,480 B1 | 12/2018 | Kawamura | |
| 10,460,814 B2* | 10/2019 | Dak | G11C 11/4097 |
| 10,636,494 B2* | 4/2020 | Yang | G11C 16/24 |
| 2003/0184360 A1 | 10/2003 | Wang | |
| 2008/0215802 A1 | 9/2008 | Chow | |
| 2012/0033500 A1 | 2/2012 | Dutta | |
| 2012/0129301 A1 | 5/2012 | Or-Bach | |
| 2013/0130468 A1 | 5/2013 | Higashitani | |
| 2013/0154055 A1 | 6/2013 | Park | |
| 2013/0194867 A1 | 8/2013 | Fukuda et al. | |
| 2017/0018570 A1 | 1/2017 | Lue et al. | |
| 2017/0053932 A1* | 2/2017 | Jeon | H01L 27/11582 |
| 2017/0213817 A1* | 7/2017 | Mathur | H01L 27/0203 |
| 2017/0243878 A1 | 8/2017 | Kim | |
| 2020/0013434 A1* | 1/2020 | Lin | G11C 16/08 |
| 2020/0013714 A1* | 1/2020 | Lin | H01L 23/5283 |
| 2020/0013794 A1* | 1/2020 | Dunga | G11C 16/28 |
| 2020/0013795 A1* | 1/2020 | Dunga | G11C 5/14 |

OTHER PUBLICATIONS

PCT Written Opinion of the International Searching Authority dated Sep. 18, 2019, PCT Patent Application No. PCT/US2019/033905.

PCT International Search Report dated Sep. 18, 2019, PCT Patent Application No. PCT/US2019/033910.

PCT Written Opinion of the International Searching Authority dated Sep. 18, 2019, PCT Patent Application No. PCT/US2019/033910.

Dunga, et al., "Non-Volatile Memory With Pool Capacitor," U.S. Patent Application filed Sep. 25, 2018.

Office Action dated Apr. 23, 2020, U.S. Appl. No. 16/141,163.

Office Action dated Apr. 6, 2020, U.S. Appl. No. 16/141,163.

Response to Office Action dated Mar. 16, 2020, U.S. Appl. No. 16/141,163.

Office Action dated Feb. 26, 2020, U.S. Appl. No. 16/141,163.

Response to Office Action dated Jun. 16, 2020, U.S. Appl. No. 16/141,163.

Notice of Allowance dated Aug. 10, 2020, U.S. Appl. No. 16/141,163.

* cited by examiner

Figure 3D
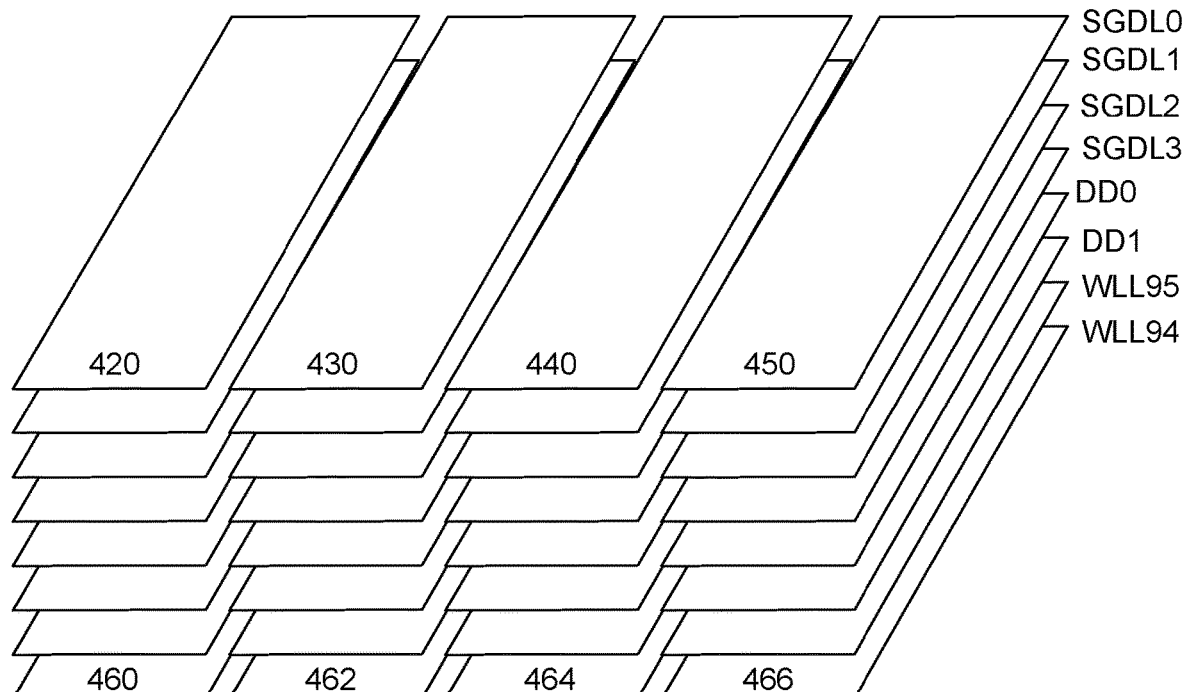
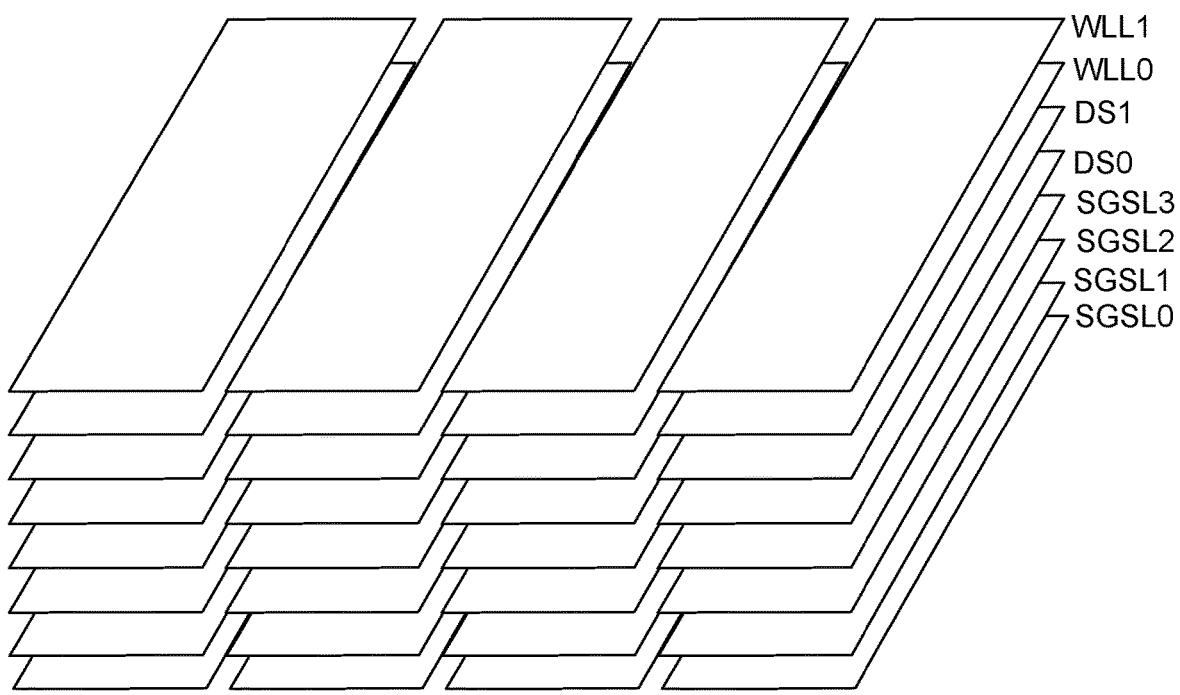

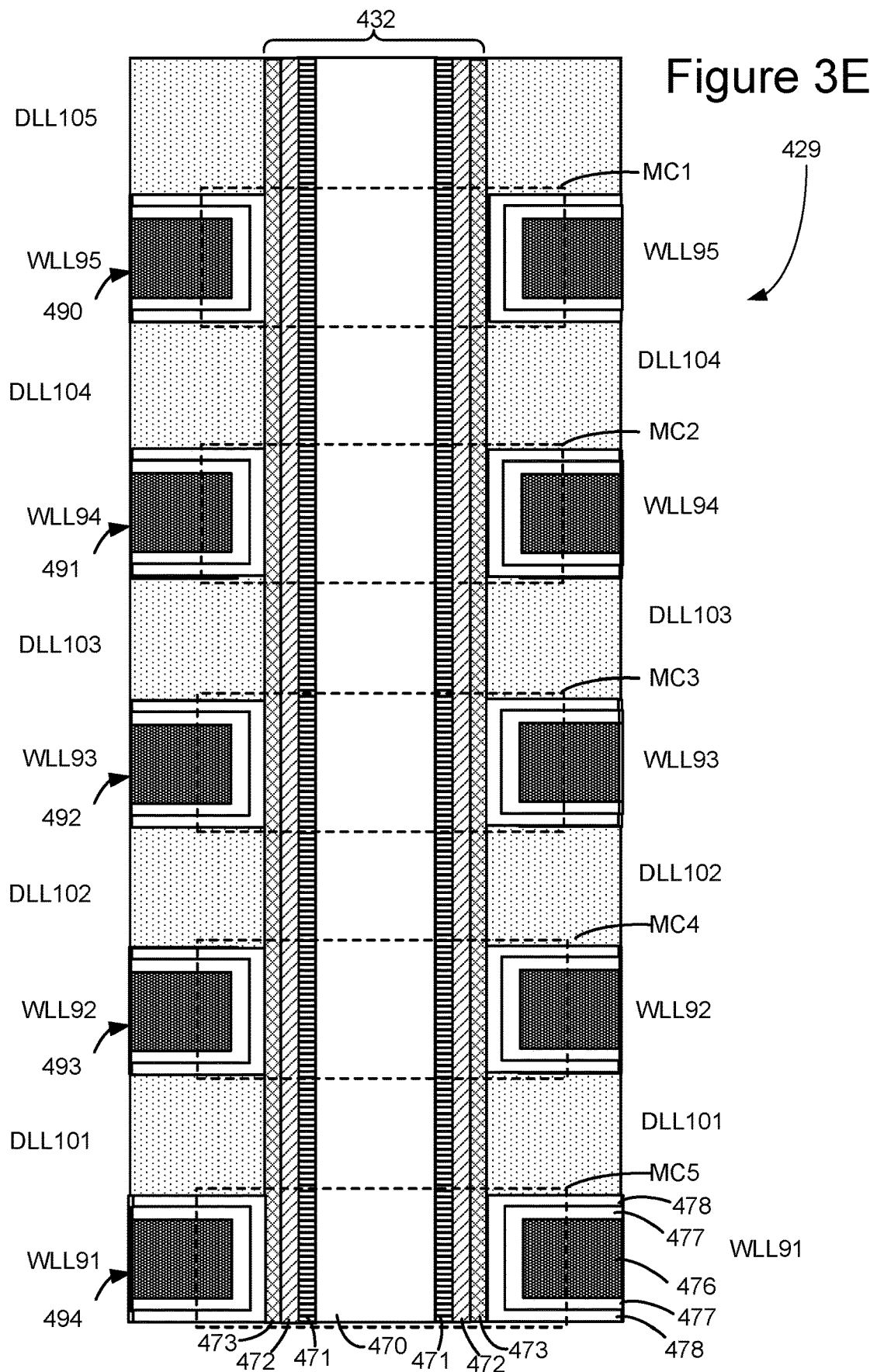

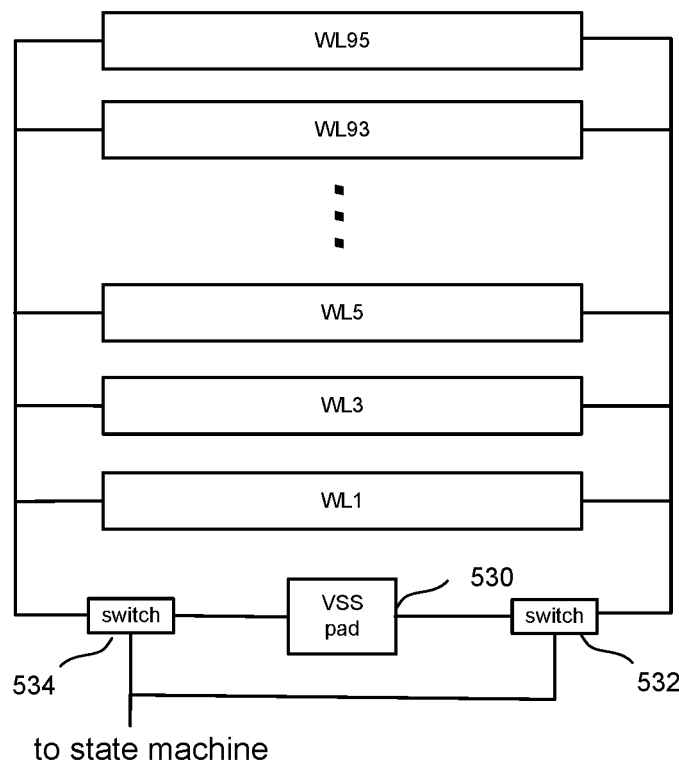
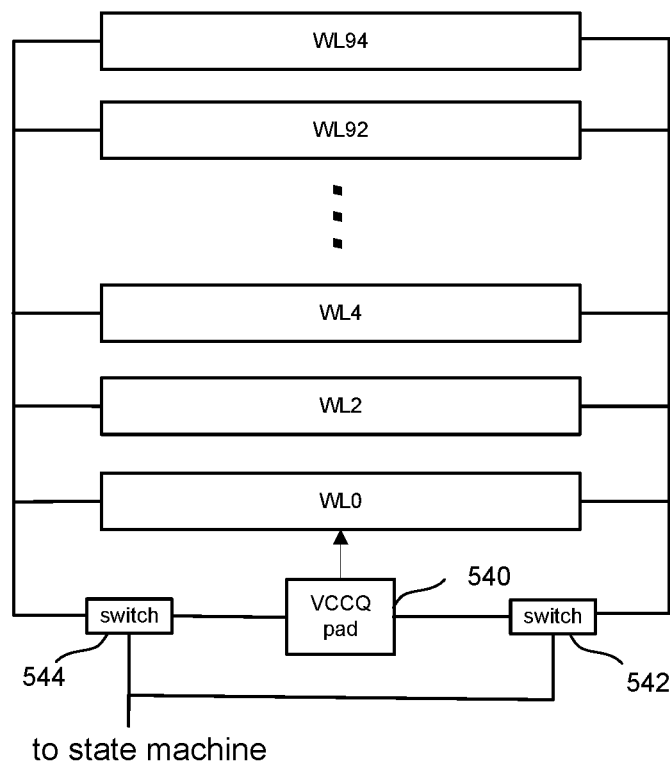
Figure 5

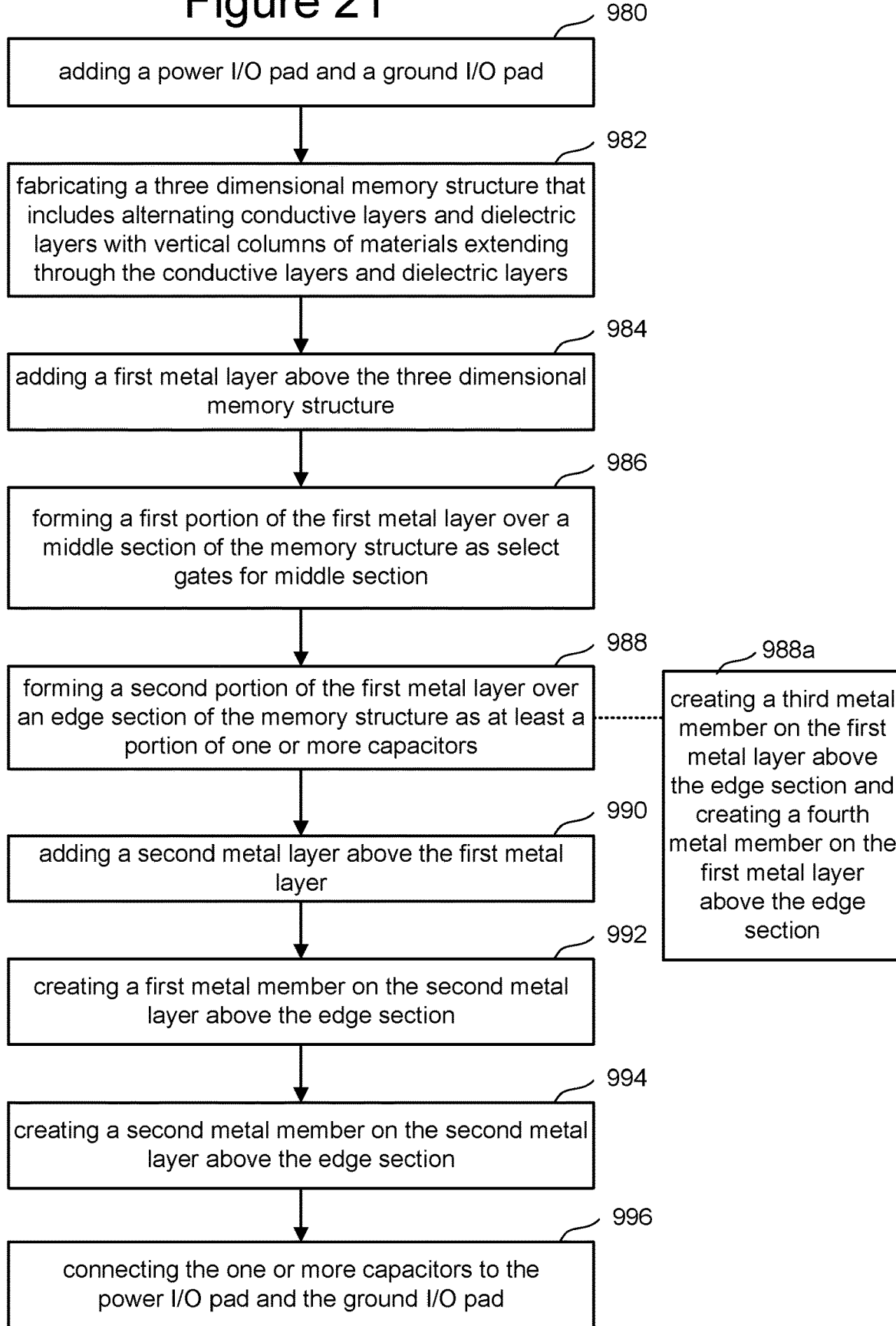

NON-VOLATILE MEMORY WITH POOL CAPACITOR

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory).

Memory systems can be used to store data provided by a host device, client, user or other entity. It is important that the memory system function properly so that data can be stored in the memory system and read back accurately.

BRIEF DESCRIPTION OF THE DRAWINGS

Like-numbered elements refer to common components in the different figures.

FIG. 3D depicts a view of the select gate layers and word line layers.

FIG. 3E is a cross sectional view of a vertical column of memory cells.

FIG. 5 depicts the connection of word lines to I/O pads; for example, depict the word lines functioning as a capacitor connected to the power I/O pad.

FIG. 21 is a flow chart describing a portion of one embodiment of a process for fabricating a memory die.

DETAILED DESCRIPTION

A memory die is a semiconductor die that has a memory system implemented thereon. Typically, a memory die has a memory structure, peripheral circuits connected to the memory structure and an Input/Output ("I/O") interface connected to the peripheral circuits and the memory structure. For purposes of this document, an I/O interface is a structure that serves as the point where signals inside the memory die meet signals outside the memory die. One embodiment of an I/O interface includes a set of I/O pads, which allow signals internal to the memory die to connect to the world outside of the memory die. In some examples, the I/O pads are connected to I/O pins of a package. In some embodiments of a memory die, the set of I/O pads of the I/O interface includes data I/O pads for data signals, control I/O pads for control signals, power I/O pads for power, and ground I/O pads to connect to ground.

Due to active switching of the inputs and outputs of a memory die, there can be large swings in current on a power I/O pad. This change in the current on the power I/O pad can lead to distortion of other signals. For example, some memory die have a clock I/O pad, for a synchronization clock signal. The change in the current on the power I/O pad can lead to distortion of the synchronization clock signal so that the duty cycle of the synchronization clock signal is altered in a manner that prevents the synchronization clock signal from reliably synchronizing components.

In order to solve the problem associated with large swings in current on a power I/O pad, it is proposed to connect the power I/O pad to one or more pool capacitors. However, simply adding capacitors to the memory die may cause the memory die to increase in size, which is not desired since there is a demand for smaller memory die for smaller electronic devices. Thus, it is proposed to convert unused portions of the memory die to usable pool capacitors for the power I/O pad. This technology can also be used to provide capacitors for other I/O pads or other types of I/O interfaces. Additionally, the proposed technology can be used on semiconductors dies other than memory dies.

One embodiment includes a non-volatile memory structure, a peripheral circuit connected to the memory structure, and an I/O interface connected to the peripheral circuit. A section (e.g., an unused section) of the memory structure is configured to operate as a capacitor and is connected to the I/O interface.

Another embodiment includes a non-volatile memory structure comprising a user data section and a dummy section, a capacitor positioned above the dummy section and an I/O interface connected to the capacitor.

Figure 1:
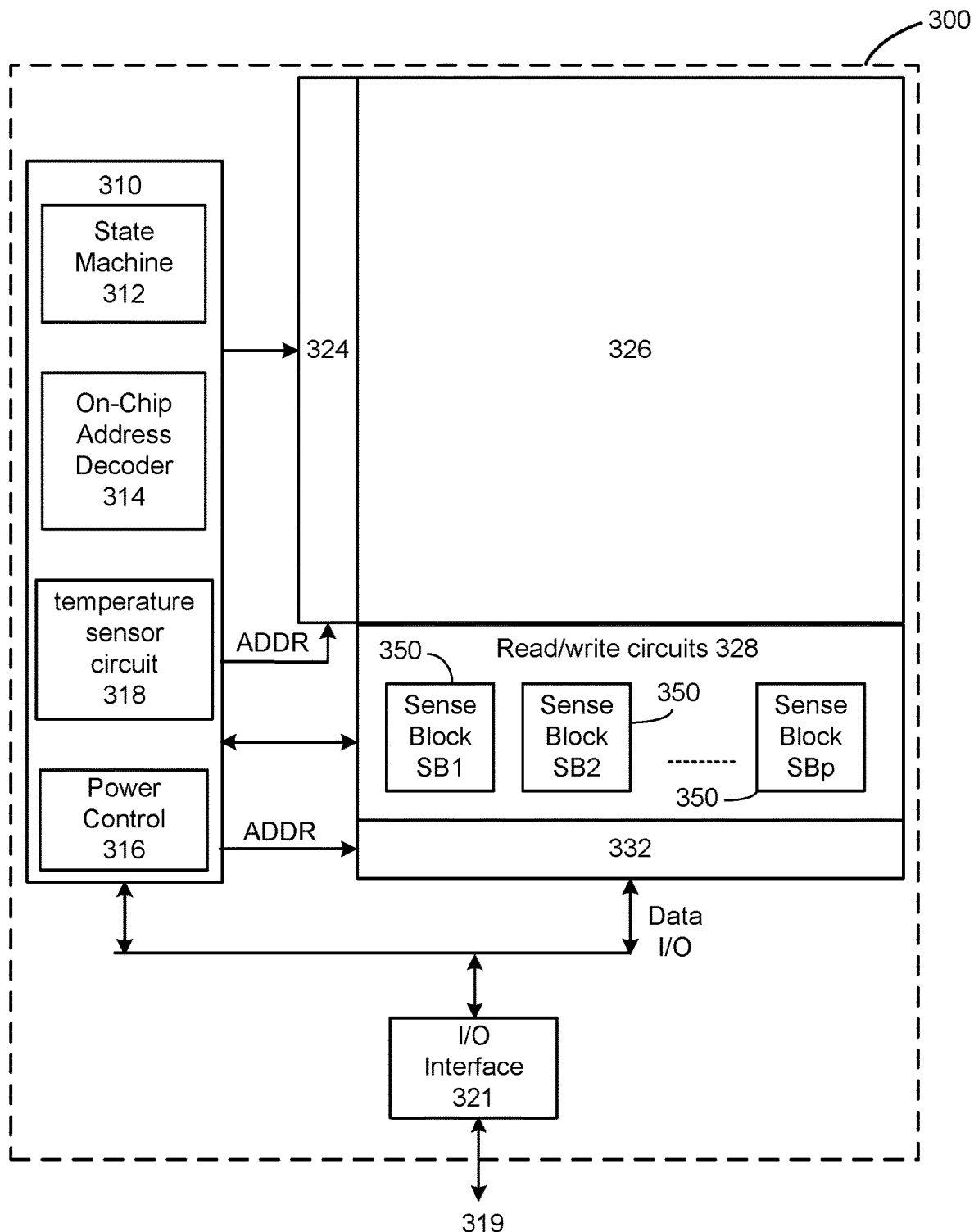
FIG. 1 is a block diagram of one embodiment of a memory die.

FIG. 1 is a functional block diagram of one embodiment of a memory die 300 that implements the technology proposed herein for using a portion of memory die as a pool capacitor for the I/O interface. The components depicted in FIG. 1 are electrical circuits. In one embodiment, each memory die 300 includes a memory structure 326, control circuitry 310, and read/write circuits 328. Memory structure 326 is addressable by word lines via a row decoder 324 and by bit lines via a column decoder 332. The read/write circuits 328 include multiple sense blocks 350 including SB1, SB2, . . . , SBp (sensing circuitry) and allow a page (or multiple pages) of data in multiple memory cells to be read or programmed (written) in parallel. In one embodiment, each sense block include a sense amplifier and a set of latches connected to the bit line. The latches store data to be written and/or data that has been read. The sense amplifiers include bit line drivers.

Memory dies 300 includes I/O interface 321, which is connected to control circuitry 310, column decoder 332, read/write circuits 328 and memory structure 326. Commands and data are transferred between the controller and the memory die 300 via lines 319 that connect to I/O interface 321. In one embodiment, I/O interface 321 includes a set of I/O pads.

I/O interface 321 can be a synchronous interface or an asynchronous interface. Examples of an I/O interface include a Toggle Mode Interface and an Open NAD Flash Interface (ONFI). Other I/O interfaces can also be used. Toggle mode (e.g., Toggle Mode 2.0 JEDEC Standard or Toggle Mode 800) is an asynchronous memory interface that supports SDR and DDR with a DQS signal acting as a data strobe signal. Table 1 provides a definition of one example of a Toggle Mode Interface. For each of the signals listed in the table below, I/O Interface has a corresponding I/O pad.

TABLE 1

| Signal Name | Type | Function |
| --- | --- | --- |
| ALE | Input | Address Latch Enable controls the activating path for addresses to the internal address registers. Addresses are latched on the rising edge of WEn with ALE high. |
| CEn | | Chip Enable controls memory die selection. |
| CLE | Input | Command Latch Enable controls the activating path for commands sent to the command register. When active high, commands are latched into the command register through the I/O ports on the rising edge of the WEn signal. |
| RE | Input | Read Enable Complement |
| REn | Input | Read Enable controls serial data out, and when active, drives the data onto the I/O bus. |
| WEn | Input | Write Enable controls writes to the I/O port. Commands and addresses are latched on the rising edge of the WEn pulse. |
| WPn | Input | Write Protect provides inadvertent program/erase protection during power transitions. The internal high voltage generator is reset when the WPn pin is active low. |
| DQS | Input/Output | Data Strobe acts as an output when reading data, and as an input when writing data. DQS is edge-aligned with data read; it is center- |

TABLE 1-continued

| Signal Name | Type | Function |
| --- | --- | --- |
| | | aligned with data written. |
| DQSn | Input/Output | Data Strobe complement (used for DDR) |
| Bus[0:7] | Input/Output | Data Input/Output (I/O) bus inputs commands, addresses, and data, and outputs data during Read operations. The I/O pins float to High-z when the chip is deselected or when outputs are disabled. |
| R/Bn | Output | Ready/Busy indicates device operation status. R/Bn is an open-drain output and does not float to High-z when the chip is deselected or when outputs are disabled. When low, it indicates that a program, erase, or random read operation is in process; it goes high upon completion. |
| ZQ | Supply | Reference for ZQ calibration. |
| VCC | Supply | Power supply for memory die. |
| VCCQ | Supply | I/O power for I/O signals |
| VPP | Supply | Optional, high voltage, external power supply |
| VREF | Supply | Reference voltage, reserved fir Toggle Mode DDR2 |
| VSS | Supply | Ground |

As described above, due to active switching of the inputs and outputs of I/O Interface 321, there can be large swings in current on VCCQ. This change in the current on the VCCQ can lead to distortion of other signals such as DQS. The signal DQS is supposed to have a 50% duty cycle, but due to large swings in current on VCCQ, the duty cycle may be different than 50%, which can cause a signaling problem that prevents proper communication between the memory die and controller. In order to solve this problem, it is proposed to connect the power I/O pad (e.g. the I/O pad for VCCQ) to one or more pool capacitors. However, simply adding capacitors to the memory die may cause the memory die to increase in size, which is not desired since the is a demand for smaller memory die for smaller electronic devices. Thus, it is proposed to convert unused portions of the memory die to usable pool capacitors for the power I/O pad.

Looking back at FIG. 1, control circuitry 310 cooperates with the read/write circuits 328 to perform memory operations (e.g., write, read, erase, and others) on memory structure 326. In one embodiment, control circuitry 310 includes a state machine 312, an on-chip address decoder 314, a power control circuit 316 and a temperature sensor circuit 318. State machine 312 provides die-level control of memory operations. In one embodiment, state machine 312 is programmable by software. In other embodiments, state machine 312 does not use software and is completely implemented in hardware (e.g., electrical circuits). In some embodiments, state machine 312 can be replaced by a microcontroller or microprocessor. In one embodiment, control circuitry 310 includes buffers such as registers, ROM fuses and other storage devices for storing default values such as base voltages and other parameters. Temperature sensor circuit 318 detects current temperature at memory die 300.

The on-chip address decoder 314 provides an address interface between addresses used by controller 120 to the hardware address used by the decoders 324 and 332. Power control module 316 controls the power and voltages supplied to the word lines and bit lines during memory operations. Power control module 316 may include charge pumps for creating voltages.

For purposes of this document, control circuitry 310, read/write circuits 328 and decoders 324/332 comprise one embodiment of a control circuit for memory structure 326.

In other embodiments, other circuits that support and operate on memory structure 326 can be referred to as a control circuit. For example, in some embodiments, the controller can operate as the control circuit or can be part of the control circuit.

In one embodiment, memory structure 326 comprises a three dimensional memory array of non-volatile memory cells in which multiple memory levels are formed above a single substrate, such as a wafer. The memory structure may comprise any type of non-volatile memory that is monolithically formed in one or more physical levels of arrays of memory cells having an active area disposed above a silicon (or other type of) substrate. In one example, the non-volatile memory cells of memory structure 326 comprise vertical NAND strings with charge-trapping material such as described, for example, in U.S. Pat. No. 9,721,662, incorporated herein by reference in its entirety. A NAND string includes memory cells connected by a channel.

In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory cell technologies can be used to form memory structure 326. No particular non-volatile memory technology is required for purposes of the new claimed embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 326 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 2:
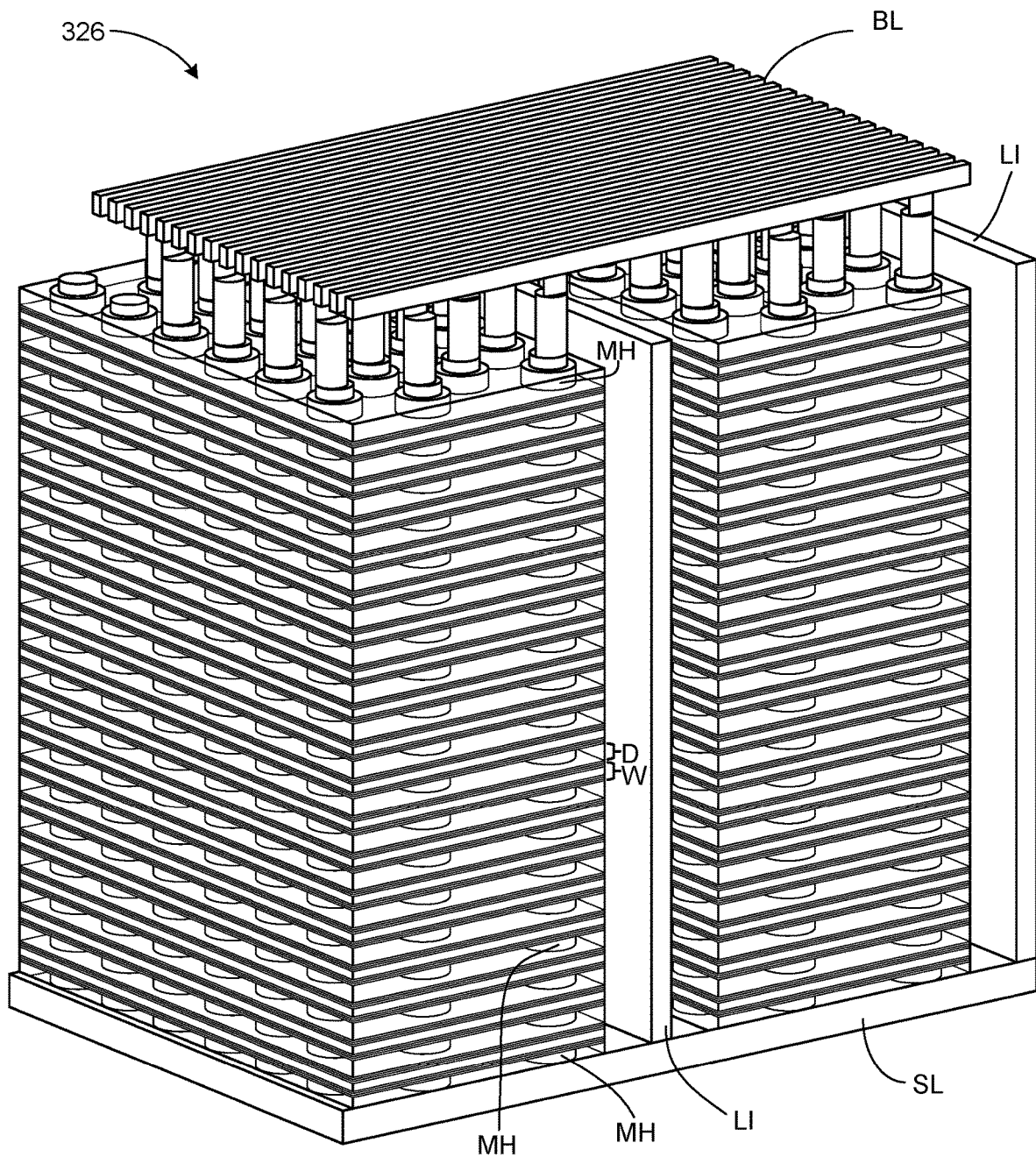
FIG. 2 is a perspective view of a portion of one embodiment of a monolithic three dimensional memory structure.

FIG. 2 is a perspective view of a portion of one example embodiment of a monolithic three dimensional memory array that can comprise memory structure 326, which includes a plurality non-volatile memory cells. For example, FIG. 2 shows a portion of one block of memory. The structure depicted includes a set of bit lines BL positioned above a stack of alternating dielectric layers and conductive layers with vertical columns of materials extending through the dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-300 alternating dielectric layers and conductive layers. One example embodiment includes 96 data word line layers, 8 select layers, 6 dummy word line layers and 110 dielectric layers. More or less than 108-300 layers can also be used. As will be explained below, the alternating dielectric layers and conductive layers are divided into four "fingers" or sub-blocks by local interconnects LI. FIG. 2 shows two fingers and two local interconnects LI. Below the alternating dielectric layers and word line layers is a source line layer SL. Vertical columns of materials (also known as memory holes) are formed in the stack of alternating dielectric layers and conductive layers. For example, one of the vertical columns/memory holes is marked as MH. Note that in FIG. 2, the dielectric layers are depicted as see-through so that the reader can see the memory holes positioned in the stack of alternating dielectric layers and conductive layers. In one embodiment, NAND strings are formed by filling the vertical column/memory hole with materials including a charge-trapping material to create a vertical column of memory cells. Each memory cell can store one or more bits of data. More details of the three dimensional monolithic memory array that comprises memory structure 126 is provided below with respect to FIG. 3A-3F.

Figure 3A:
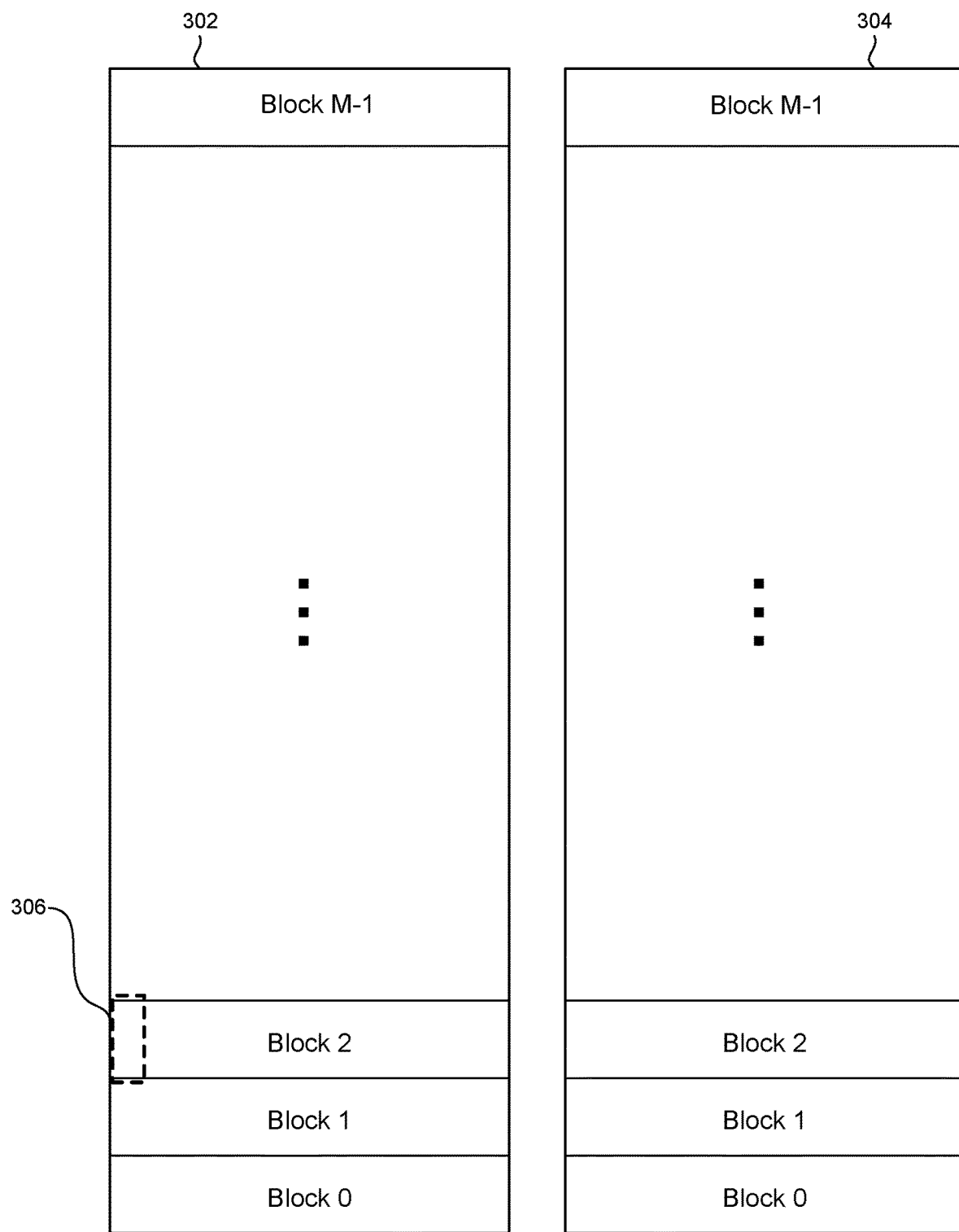
FIG. 3A is a block diagram of a memory structure having two planes.

FIG. 3A is a block diagram explaining one example organization of memory structure 326, which is divided into two planes 302 and 304. Each plane is then divided into M blocks. In one example, each plane has about 2000 blocks. However, different numbers of blocks and planes can also be used. In on embodiment, a block of memory cells is a unit of erase. That is, all memory cells of a block are erased together. In other embodiments, memory cells can be grouped into blocks for other reasons, such as to organize the memory structure 326 to enable the signaling and selection circuits. In one embodiment, a block represents a groups of connected memory cells as the memory cells of a block share a common set of unbroken word lines and unbroken bit lines. In the structure of FIG. 3A, Block 0 and Block M−1 of both planes 302 and 304 are at the edge of the memory structure (or otherwise referred to as being located in an edge region/section of the memory structure).

Figure 3B:
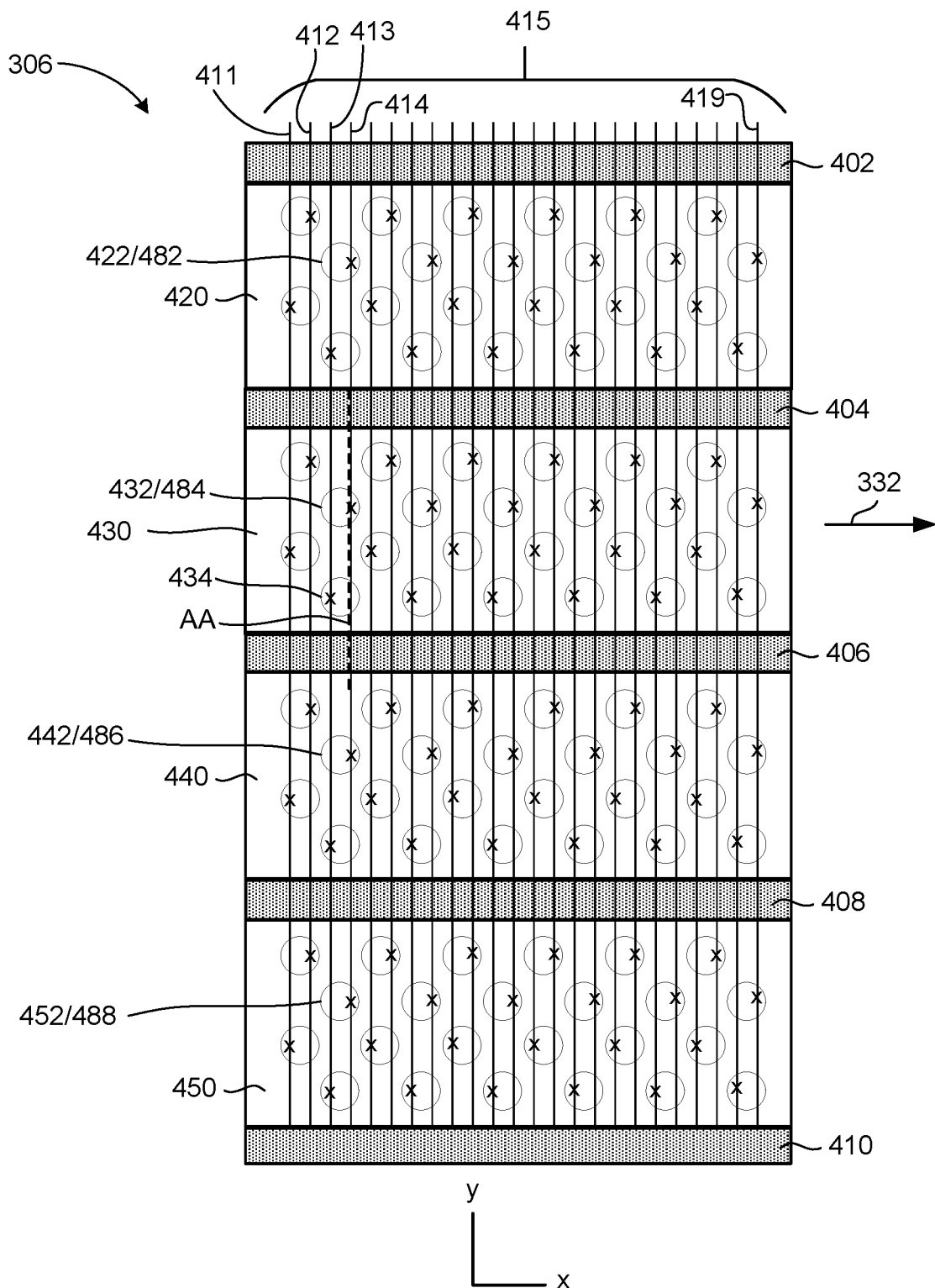
FIG. 3B depicts a top view of a portion of a block of memory cells.

FIGS. 3B-3F depict an example three dimensional ("3D") NAND structure that corresponds to the structure of FIG. 2 and can be used to implement memory structure 326 of FIG. 1. FIG. 3B is a block diagram depicting a top view of a portion of one block from memory structure 326. The portion of the block depicted in FIG. 3B corresponds to portion 306 in block 2 of FIG. 3A. As can be seen from FIG. 3B, the block depicted in FIG. 3B extends in the direction of 332. In one embodiment, the memory array has many layers; however, FIG. 3B only shows the top layer.

FIG. 3B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 3B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 3B extends in the direction of arrow 330 and in the direction of arrow 332, the block includes more vertical columns than depicted in FIG. 3B FIG. 3B also depicts a set of bit lines 415, including bit lines 411, 412, 413, 414, . . . 419. FIG. 3B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 414 is connected to vertical columns 422, 432, 442 and 452. In some embodiments, bit lines are positioned over the memory structure 325 and run along the entire length of the plane (e.g., from the top of plane 302 to the bottom of plane 302).

The block depicted in FIG. 3B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 3B is divided into regions 420, 430, 440 and 450, which are referred to as fingers or sub-blocks. In the layers of the block that implement memory cells, the four regions are referred to as word line fingers that are separated by the local interconnects. In one embodiment, the word line fingers on a common level of a block connect together to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Although FIG. 3B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 3B also shows the vertical columns being staggered. In other embodiments, different patterns of staggering can be used. In some embodiments, the vertical columns are not staggered.

Figure 3C:
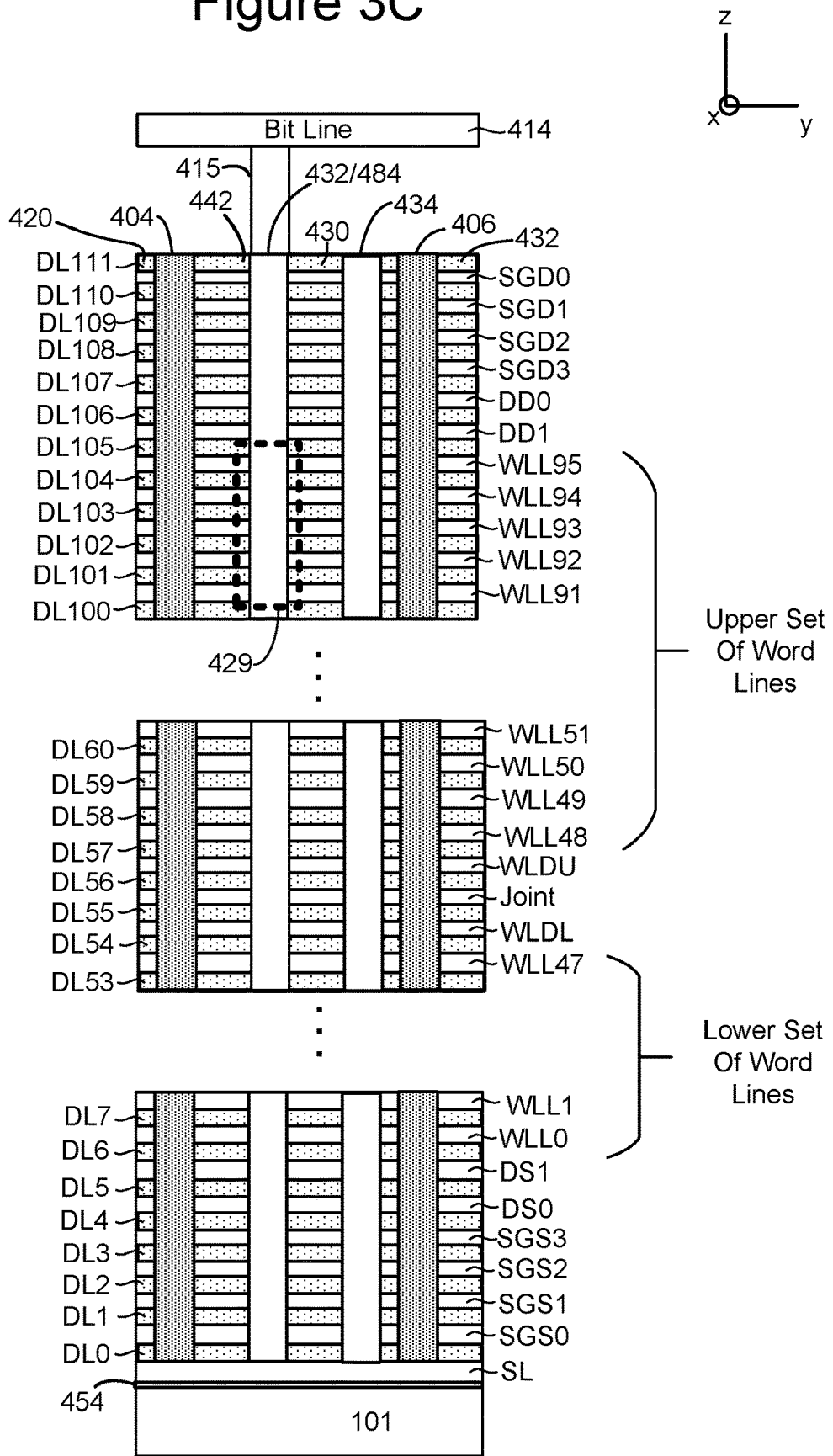
FIG. 3C depicts a cross sectional view of a portion of a block of memory cells.

FIG. 3C depicts a portion of one embodiment of a three dimensional memory structure 326 showing a cross-sectional view along line AA of FIG. 3B. This cross sectional view cuts through vertical columns 432 and 434 and region 430 (see FIG. 3B). The structure of FIG. 3C includes four drain side select layers SGD0, SGD1, SGD2 and SGD3; four source side select layers SGS0, SGS1, SGS2 and SGS3; six dummy word line layers DD0, DD1, DS0, DS1, WLDL, WLDU; and ninety six data word line layers WLL0-WLL95 for connecting to data memory cells. Other embodiments can implement more or less than four drain side select layers, more or less than four source side select layers, more or less than six dummy word line layers, and more or less than ninety six word lines. Vertical columns 432 and 434 are depicted protruding through the drain side select layers, source side select layers, dummy word line layers and word line layers. In one embodiment, each vertical column comprises a vertical NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 3B, FIG. 3C show vertical column 432 connected to Bit Line 414 via connector 415. Local interconnects 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0, DS1, WLDL and WLDU; and word line layers WLL0-WLL95 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL111. For example, dielectric layers DL104 is above word line layer WLL94 and below word line layer WLL95. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WLL0-WLL95 connect to memory cells (also called data memory cells). Dummy word line layers DD0, DD1, DS0, DS1, WLDL and WLDU connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. A dummy word line is connected to dummy memory cells. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 3C also shows a Joint area. In one embodiment it is expensive and/or challenging to etch ninety six word line layers intermixed with dielectric layers. To ease this burden, one embodiment includes laying down a first stack of forty eight word line layers alternating with dielectric layers, laying down the Joint area, and laying down a second stack of forty eight word line layers alternating with dielectric layers. The Joint area is positioned between the first stack and the second stack. The Joint area is used to connect to the first stack to the second stack. In FIG. 3C, the first stack is labeled as the "Lower Set of Word Lines" and the second stack is labeled as the "Upper Set of Word Lines." In one embodiment, the Joint area is made from the same materials as the word line layers. In one example set of implementations, the plurality of word lines (control lines) comprises a first stack of alternating word line layers and dielectric layers, a second stack of alternating word line layers and dielectric layers, and a joint area between the first stack and the second stack, as depicted in FIG. 3C.

FIG. 3D depicts a logical representation of the conductive layers (SGD0, SGD1, SGD2, SGD3, SGS0, SGS1, SGS2, SGS3, DD0, DD1, DS0, DS1, and WLL0-WLL95) for the block that is partially depicted in FIG. 3C. As mentioned above with respect to FIG. 3B, in one embodiment local interconnects 402, 404, 406, 408 and 410 break up the conductive layers into four regions/fingers (or sub-blocks). For example, word line layer WLL94 is divided into regions 460, 462, 464 and 466. For word line layers (WLL0-WLL127), the regions are referred to as word line fingers; for example, word line layer WLL126 is divided into word line fingers 460, 462, 464 and 466. For example, region 460 is one word line finger on one word line layer. In one embodiment, the four word line fingers on a same level are connected together. In another embodiment, each word line finger operates as a separate word line.

Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

FIG. 3E depicts a cross sectional view of region 429 of FIG. 3C that includes a portion of vertical column 432 (a memory hole) that extends through the alternating conductive layers and dielectric layers. In one embodiment, the vertical columns are round; however, in other embodiments other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line and the source line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 3E depicts dielectric layers DLL105, DLL104, DLL103, DLL102 and DLL101, as well as word line layers WLL95, WLL94, WLL93, WLL92, and WLL91. Each of the word line layers includes a word line region 476 surrounded by an aluminum oxide layer 477, which is surrounded by a blocking oxide ($SiO_2$) layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL95 and a portion of vertical column 432 comprise a memory cell MC1. Word line layer WLL94 and a portion of vertical column 432 comprise a memory cell MC2. Word line layer WLL93 and a portion of vertical column 432 comprise a memory cell MC3. Word line layer WLL92 and a portion of vertical column 432 comprise a memory cell MC4. Word line layer WLL91 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 3F:
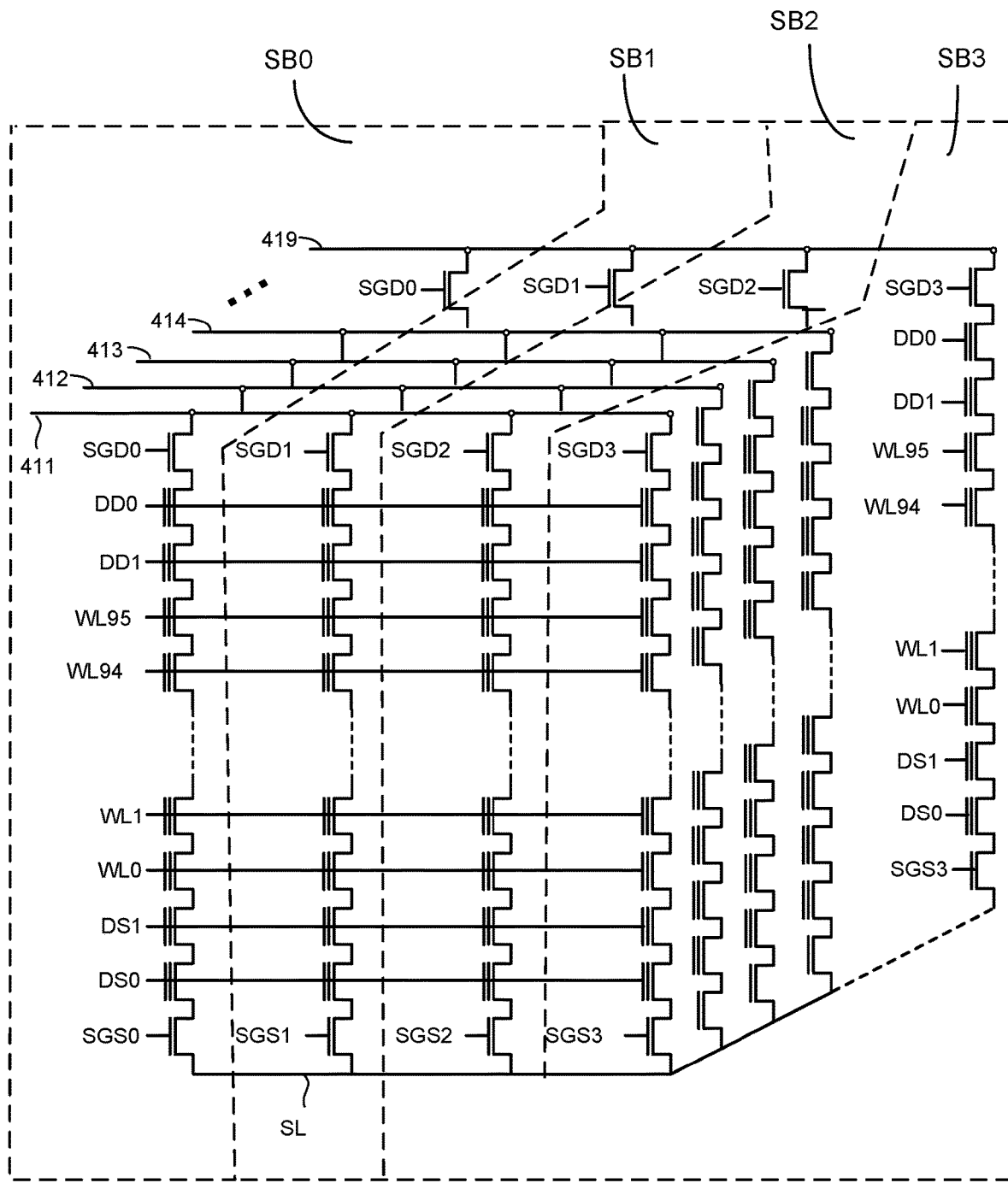
FIG. 3F is a schematic of a plurality of NAND strings showing multiple sub-blocks.

FIG. 3F is a schematic diagram of a portion of the memory depicted in in FIGS. 2-3E. FIG. 3F shows physical word lines WLL0-WLL95 running across the entire block. The structure of FIG. 3F corresponds to portion 306 in Block 2 of FIGS. 3A-E, including bit lines 411, 412, 413, 414, . . . 419. Within the block, each bit line is connected to four NAND strings. Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Figure 4:
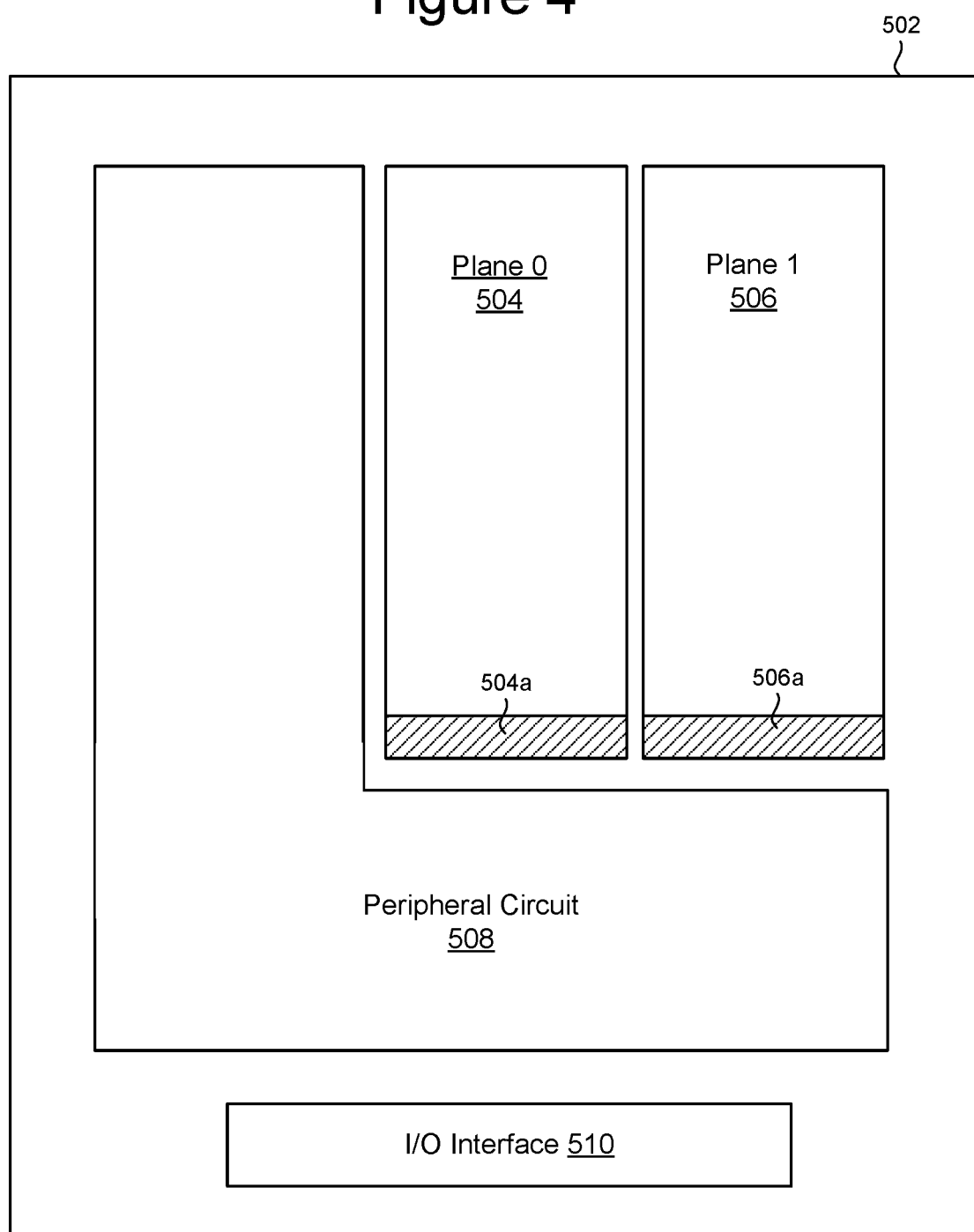
FIG. 4 is a block diagram of a memory die.

As described above, it is proposed to convert unused portions of the memory die to usable pool capacitors for the power I/O pad. FIG. 4 is a block diagram of a memory dies 502 that has converted unused portions of the memory die to usable pool capacitors for the power I/O pad. Memory die 502 may be the same structure as memory die 300 of FIG. 1. Memory die 502 includes a three dimensional memory structure that includes two planes: Plane 0 (504) and Plane 1 (506). Plane 0 (504) may be the same structure as plane 302 of FIG. 3A. Plane 1 (506) may be the same structure as plane 304 of FIG. 3A. In other embodiments, more or less than two planes can be used. Plane 0 (504) and Plane 1 (506) may implement memory structure 325, including any of the embodiments mentioned above.

Memory die 502 also includes peripheral circuit 508, which can be located to the side of the memory structure (Plane 0 and Plane 1) and/or underneath the memory structure (Plane 0 and Plane 1). Peripheral circuit 508 can include control circuitry 310, read/write circuits 328 and decoders 324/332. Peripheral circuit 508 can include any other circuit on the memory die that is used to control/operate the memory die.

Memory die 508 also includes I/O Interface 510, which may be the same as I/O Interface 321 of FIG. 1. For example, I/O Interface 510 may implement a Toggle Mode interface, as discussed above with respect to Table 1. Each I/O signal will include an I/O pad. I/O Interface 510 includes a power I/O pad (e.g., VCCQ) and a ground I/O pad (e.g., VSS).

Block 504a of Plane 0 is an edge block, as it is located at an edge section/region of the Plane 0. Block 506a of Plane 1 is an edge block, as it is located at an edge section/region of the Plane 1. In one embodiment, the edge blocks 504a and 506a are dummy blocks as they are not used to store user data (e.g., data provided from an entity outside of the memory die). The blocks that are in the interior or middle regions of Plane 0 and Plane 1 are user data blocks as they are used to store user data. Note that in some embodiments Plane 0 includes an edge/dummy block at the other end of Plane 0 (opposite end from block 504a) and Plane 1 includes an edge/dummy block at the other end of Plane 1 (opposite end from block 506a).

As mentioned above, it is proposed to convert unused portions of the memory die to usable pool capacitors for the power I/O pad. In one embodiment, the dummy blocks at the edge of the memory structure (e.g., blocks 504a and 506a) are configured to operate as a capacitor for the power I/O pad. Thus, FIG. 1 shows one example embodiment of a non-volatile memory structure (Plane 0 and Plane 1), a peripheral circuit 504 connected to the memory structure, and an I/O interface 510 connected to the peripheral circuit 508, where a section (504a and/or 506a) of the memory structure is configured to operate as a capacitor and is connected to the I/O interface 510. For the embodiments where the memory structure implements the memory array of FIGS. 3A-3F, then a section of the memory structure that includes multiple vertical columns has a first set of the conductive layers connected to the power I/O pad and a second set of the conductive layers connected to ground I/O pad such that the section of the memory structure functions as a capacitor connected to the power I/O pad, the first set of the conductive layers are interleaved with the second set of the conductive layers.

The system of FIG. 4 can also position the capacitor above the unused dummy blocks 504a and 506a. For example, when the memory structure has a user data section (user data blocks) and dummy sections (dummy blocks), then a capacitor can be positioned above the dummy section with the I/O interface connected to the capacitor.

As mentioned above, in one embodiment, the dummy blocks at the edge of the memory structure (e.g., blocks 504a and 506a) are configured to operate as a capacitor for the power I/O pad. For example, the word lines of the dummy blocks 504a and 506a can be configured to operate as capacitors for any of the pad of I/O interface 510, as depicted in FIG. 5. In one example implementation, alternating word lines are connected together. For example, even numbered word lines can be connected together and odd numbered word lines can be connected together so that an even numbered word line and its neighboring odd numbered word line form a capacitor. Other arrangements of connecting word lines together can also be used.

FIG. 5 shows all of the odd word lines (WL1, WL3, WL5, . . . WL95) connected together. At one end of the word lines, all of the odd word lines are connected to switch 532. Switch 532 is also connected to VSS pad 530. At the other end of the word lines, all of the odd word lines are connected to switch 534. Switch 534 is also connected to VSS pad 530. Switches 532 and 534 are controlled by state machine 312. When enabled, switches 532 and 534 connect the odd word lines to VSS pad 530.

FIG. 5 shows all of the even word lines (WL0, WL2, WL4, . . . WL94) connected together. At one end of the word lines, all of the even word lines are connected to switch 542. Switch 532 is also connected to VCCQ pad 540. At the other end of the word lines, all of the even word lines are connected to switch 544. Switch 544 is also connected to VCCQ pad 540. Switches 542 and 544 are controlled by state machine 312. When enabled, switches 542 and 544 connect the even word lines to VCCQ pad 540.

In another embodiment, only one switch is used per group of connected word lines. For example, only switches 532 and 542 are used (switches 534 and 544 are not used). In another embodiment, more than two switches are used per group of connected word lines. In one embodiment, switches 532, 534, 542, and 544 are transistors.

When the even word lines are connected to VCCQ pad 540 (power) and the odd word lines are connected to VSS pad 530 (ground), then the even and odd word lines function/operate as a large pool capacitor that is connected to the VCCQ pad 540. That is, the system is taking advantage of the capacitance between alternating word line layers. This large capacitance connected to VCCQ pad 540 stabilizes the current at the VCCQ pad and avoids the problem mentioned above with respect to DQS.

In the embodiment of FIG. 5, the block (or other portion) of the memory structure being used has a first set of the conductive layers (e.g., word lines) connected to the power I/O pad and a second set of the conductive layers (e.g., word lines) connected to ground I/O pad such that the section of the memory structure functions as a capacitor connected to the power I/O pad. In the example of connecting odd word lines together and even word lines together, then the first set of the conductive layers are interleaved with the second set of the conductive layers.

Figure 6:
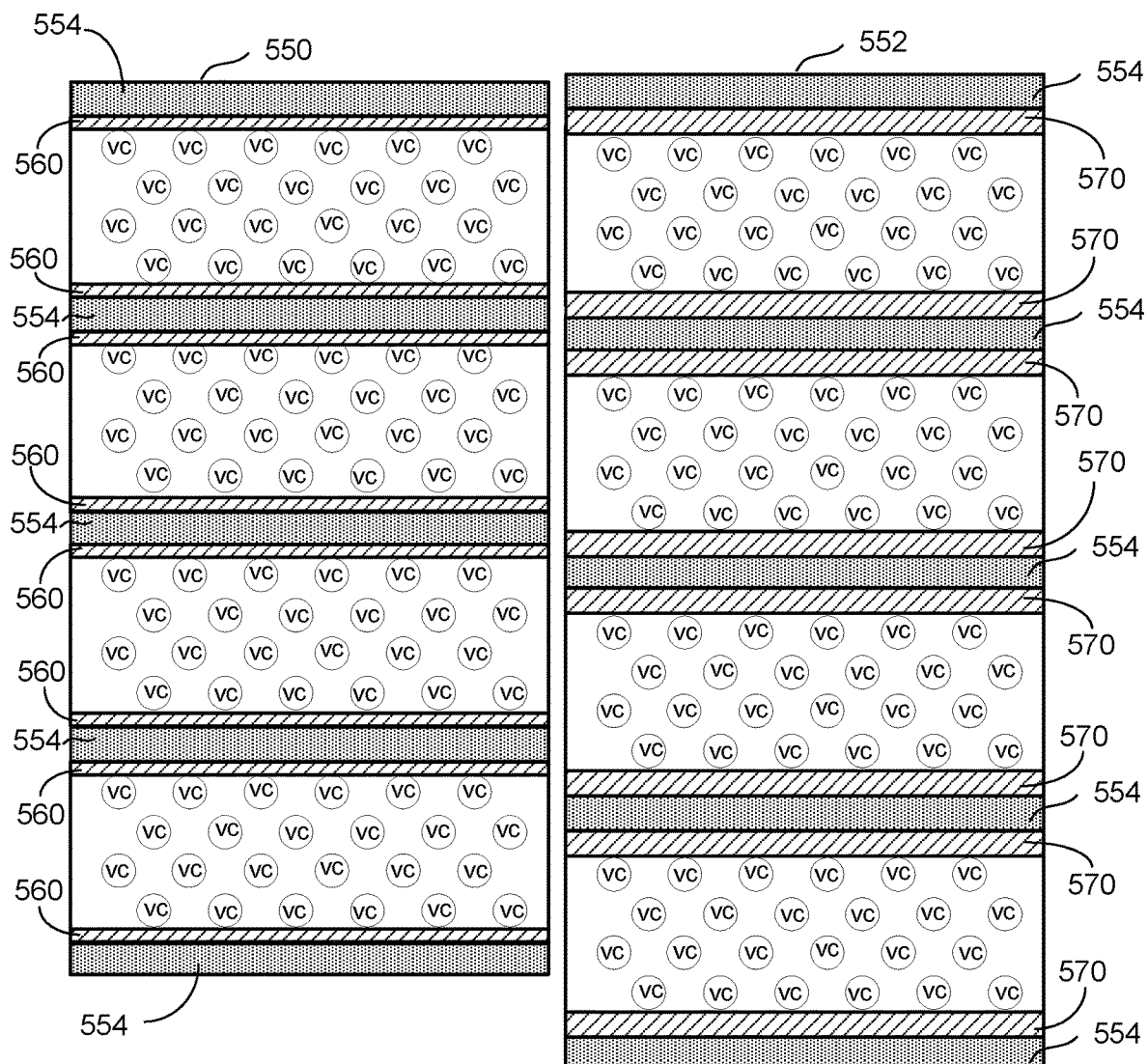
FIG. 6 is a top view of one embodiment of a three dimensional memory structure.

As depicted in FIG. 5, in one embodiment in order to configure the dummy or edge block to function as capacitors, one embodiment includes adding switches to the block. In some embodiments, configuring the dummy block (or edge block) to work as a capacitor also includes increasing the "highway width" to lower resistance of the word lines. The highway width refers to a gap between the vertical columns in a block and the adjacent border of the block or sub-block. FIG. 6 shows portions of two blocks: block 550 and block 552. Block 550 is a user data block in the interior or middle section of the memory structure. Block 552 is a dummy block located at the edge of the memory structure. Block 550 includes local interconnects 560 for separating the block into four fingers or sub-blocks. In between the local interconnects 560 and the vertical columns (vc) are gaps 560. These gaps 560 are the "highway width."

Similarly, dummy/edge block 552 includes local interconnects 554 for separating the block into four fingers or sub-blocks. Within each finger or sub-block are a set of vertical columns (vc). Between the vertical columns and the local interconnects 554 are gaps 570, also referred to as the highway width. In one embodiment, since the dummy/edge block 552 will be used as a pool capacitor for the VCCQ pad, the highway width or gap 570 for the dummy/edge block 552 is made wider than the highway width or gap 560 for the user data block in the interior of the memory structure. Another way to describe the highway width or gap 570 is a gap between the vertical columns (vc) and the adjacent border (e.g. the local interconnect 554) at the edge of the memory structure or at the edge of a sub-block of a memory structure. By increasing the width of gap 570, as compared to gap 560, the resistance of the word lines is reduced for the dummy/edge blocks.

Figure 7:
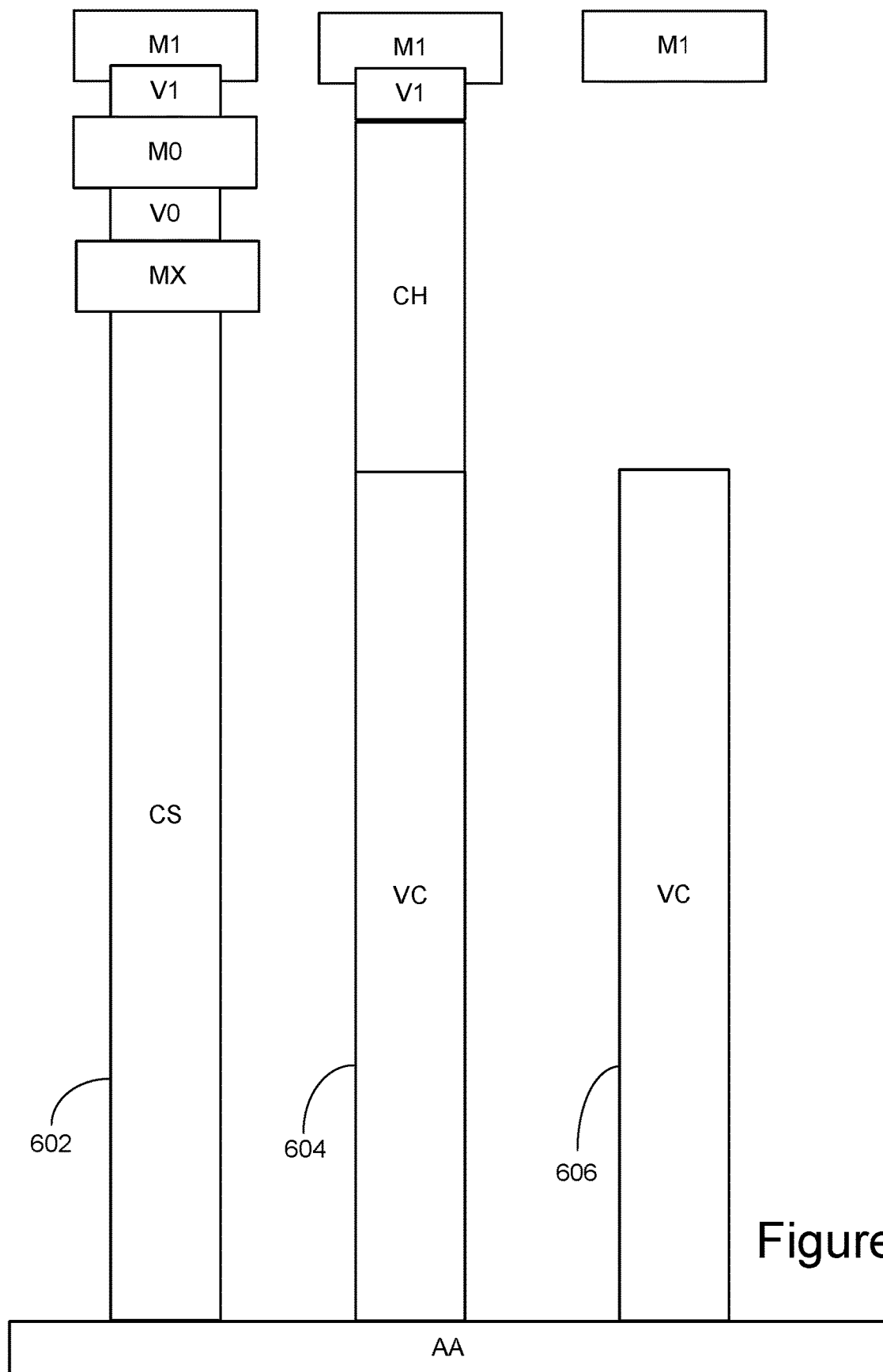
FIG. 7 depicts layers in one embodiment of a three dimensional memory structure.

FIG. 7 depicts various layers of one embodiment of three-dimensional memory structure 326 in accordance with the embodiments of FIGS. 4-6. FIG. 7 shows an active area AA which corresponds to the semiconductor substrate. Electrical circuits can be implemented on the active area. FIG. 7 shows three columns positioned on top of the active region: columns 602, 604 and 606. Column 602 pertains to peripheral circuit 508 (see FIG. 4). Column 604 pertains to a user data block in the interior of the memory structure. Column 606 pertains to a dummy block at the edge of the memory structure. Column 602 includes a first layer labeled as CS on top of the active area AA. This region CS is a connecting hole from the active area to the lowest metal layer MX; thereby, connecting circuits on the surface of the semiconductor substrate to the upper metal regions. In one embodiment, the memory structure includes three metal layers: MX, M0, and M1. Connecting metal layer MX and M0 is via V0. Connecting metal layer M1 and M0 is via V1. Each of the metal layers can initially be added to the device as a sheet and then patterned using standard processes known in the art. In one embodiment, the bit lines are implemented in metal layer M1.

Column 604 includes a vertical column vc (e.g. vertical NAND string) on top of active area AA. Above vertical column vc (which corresponds to the structure of FIG. 3E), is metal layer M1 which serves as the bit line. Connecting the vertical column to the bit line in metal layer M1 is a connecting hole CH (e.g. which is similar to a via) and via V1.

In the embodiment of FIGS. 4-7, the bit lines extend over all the blocks. Therefore, the bit lines extend over the dummy block at the edge of the memory structure; however, the bit lines are not connected to the vertical columns in the dummy block at the edge of the memory structure (in one embodiment). For example, FIG. 7 shows column 606 including a vertical column vc on top of active area AA; however, the top of vertical column vc is not connected to metal layer M1 (ie not connected to the bit line). One reason for not connecting the bit line to the vertical columns of the dummy block is so that the vertical columns will be floating. Additionally, the SGS transistors are turned off to keep the vertical columns floating.

Figure 8:
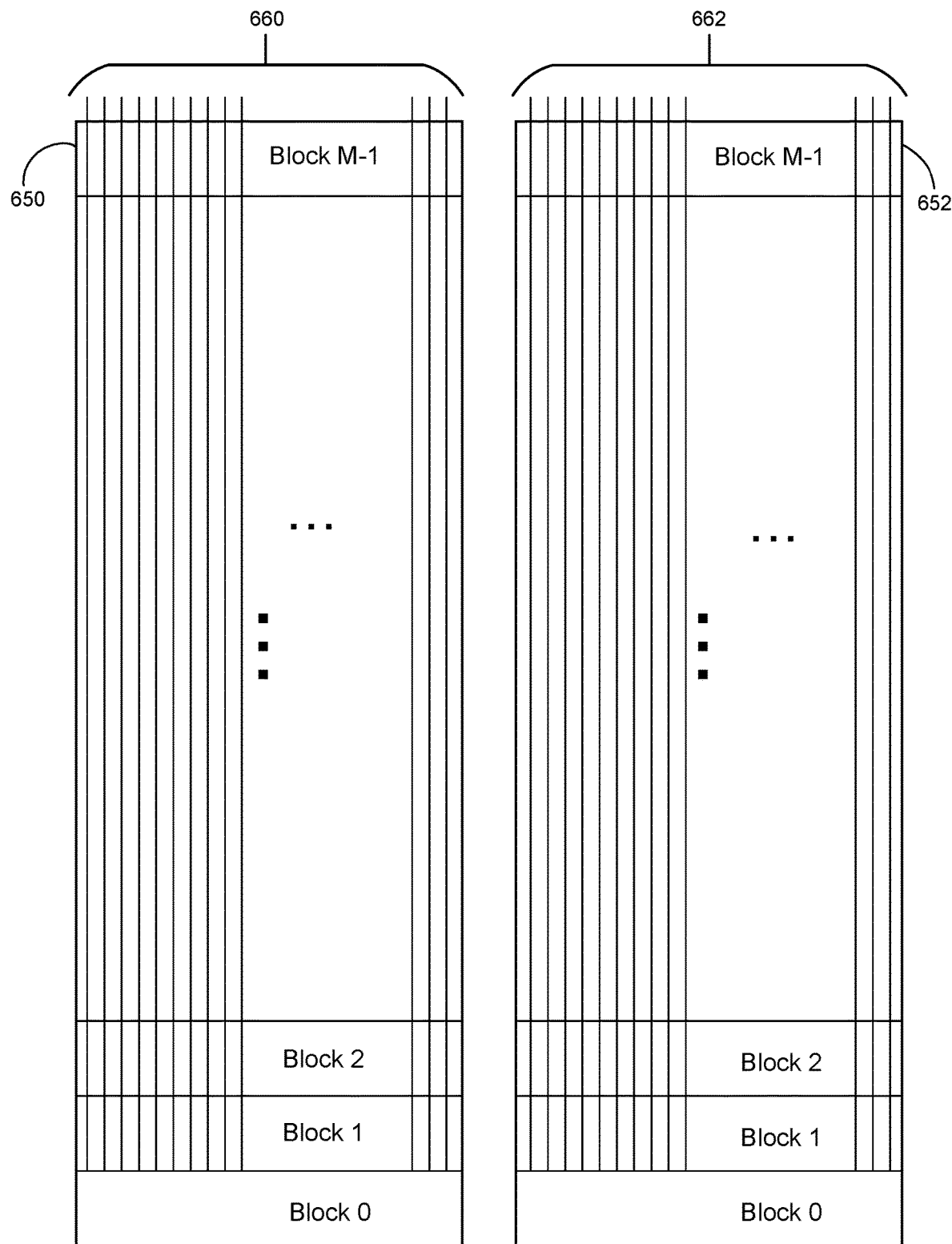
FIG. 8 depicts two planes of one embodiment of a three dimensional memory structure and bit lines across the planes.

In another embodiment, rather than not implementing the connection between the vertical column and the bit line as depicted in FIG. 7, the system can have the bit lines not extend over the dummy blocks at the edge of the memory structure. For example, FIG. 8 shows a three dimensional memory structure (e.g., memory structure 326) including Plane 0 (650) and Plane 1 (652). Each of the two planes have M blocks. Plane 0 (650) includes bit lines 660 which extend over all of the blocks except block 0, where block 0 is the dummy block at the edge of the memory structure. Similarly, Plane 2 (652) includes bit lines 662 that extend over all the blocks except block 0, where block 0 is the dummy block at the edge of the memory structure.

In another embodiment, in addition to using capacitance between alternate word line layers, the memory system will additionally use capacitance between the word line layers and the vertical columns. Such an embodiment includes all the structural changes discussed above with respect to FIGS. 4-8 and one or more additional changes. In this embodiment, the vertical columns (the vertical NAND strings) are connected to ground so that they form capacitors with those word lines connected to VCCQ. One means for connecting the vertical columns to ground is to turn on all of the SGS transistors (SGS0, SGS1, SGS2, SGS3—See FIG. 3f) and connect the source line SL (FIG. 3F) to ground. The SGS transistors can be turned on by applying a positive voltage (e.g., ~2.5-5v) to the gates via the selection lines. In another embodiment, the source line can be at a DC ground (which is not necessarily AC ground). One example implementation also includes the bit lines not extending over the dummy block at the edge of the memory structure, as depicted in FIG. 8, so as to avoid interference.

Figure 9:
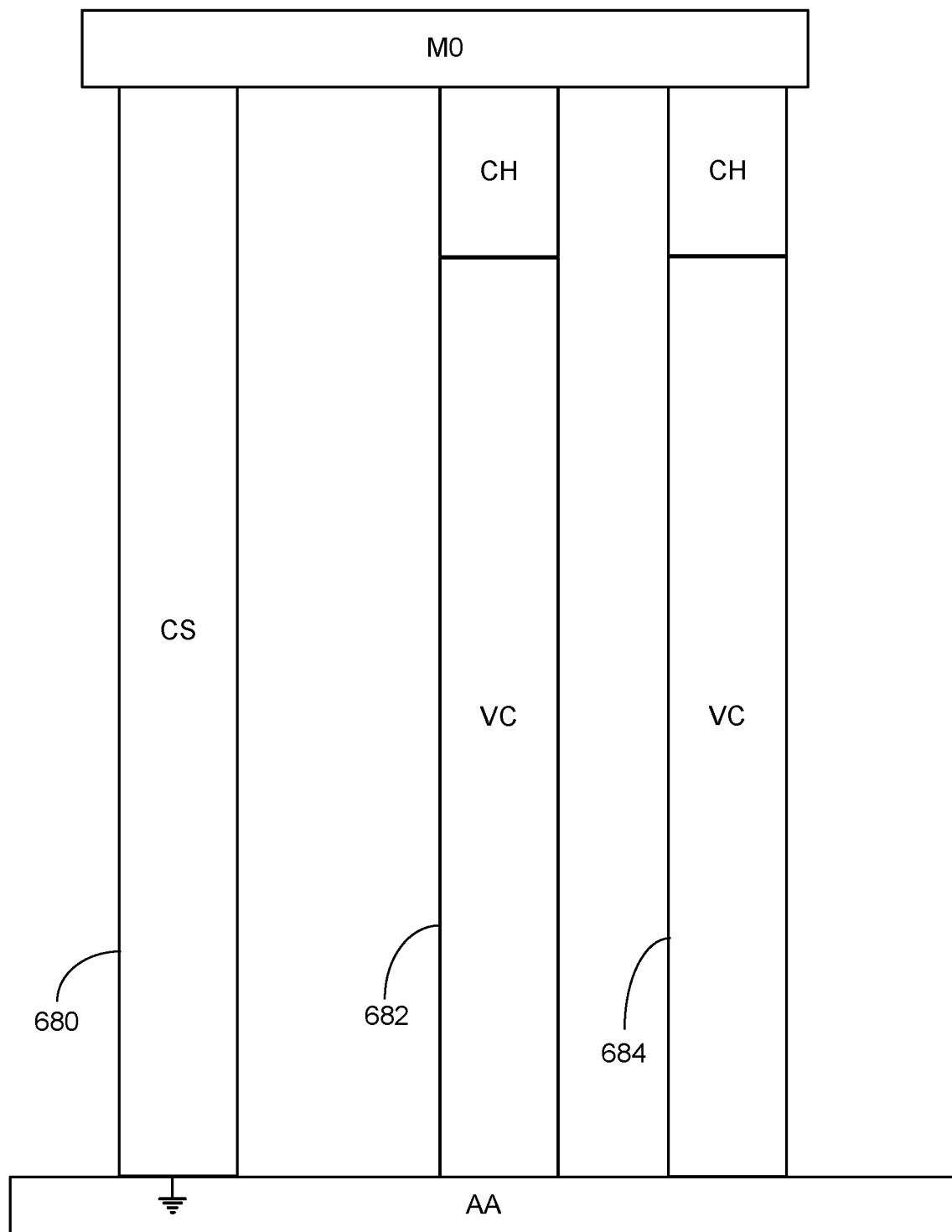
FIG. 9 depicts layers in one embodiment of a three dimensional memory structure.

In another embodiment, rather than (or in addition to) connecting the vertical columns to ground via the SGS transistors and the source line SL, the vertical columns can be connected to ground through one of the upper metal layers MX, M0 or M1. In one embodiment, layer M0 is used; however, in other embodiments other metal layers can be used. FIG. 9 depicts the layers in one embodiment for a three-dimensional memory structure (e.g., memory structure 326). FIG. 9 shows the active area AA, representing the semiconductor substrate. Three columns are depicted: 680, 682 and 684. Column 682 and 684 depict portions of the dummy block at the edge of the memory structure. The bottom of column 682 and 684 represent the vertical columns vc (e.g. vertical NAND strings). Above each vertical column vs are the connection holes ch which connect the vertical columns VC to metal layer M0. Metal layer M0 is also connected to a Connection Hole CS of column 680 in order to connect down to a ground connection on the active area AA. Although FIG. 9 shows one connection hole CS connecting AA to M0, in other embodiments, there can be other intervening metal layers and vias. The arrangement of FIG. 9 allows the channels of vertical NAND strings of the vertical columns vc to be connected to ground through metal layer M0 and another column 680.

Figure 10:
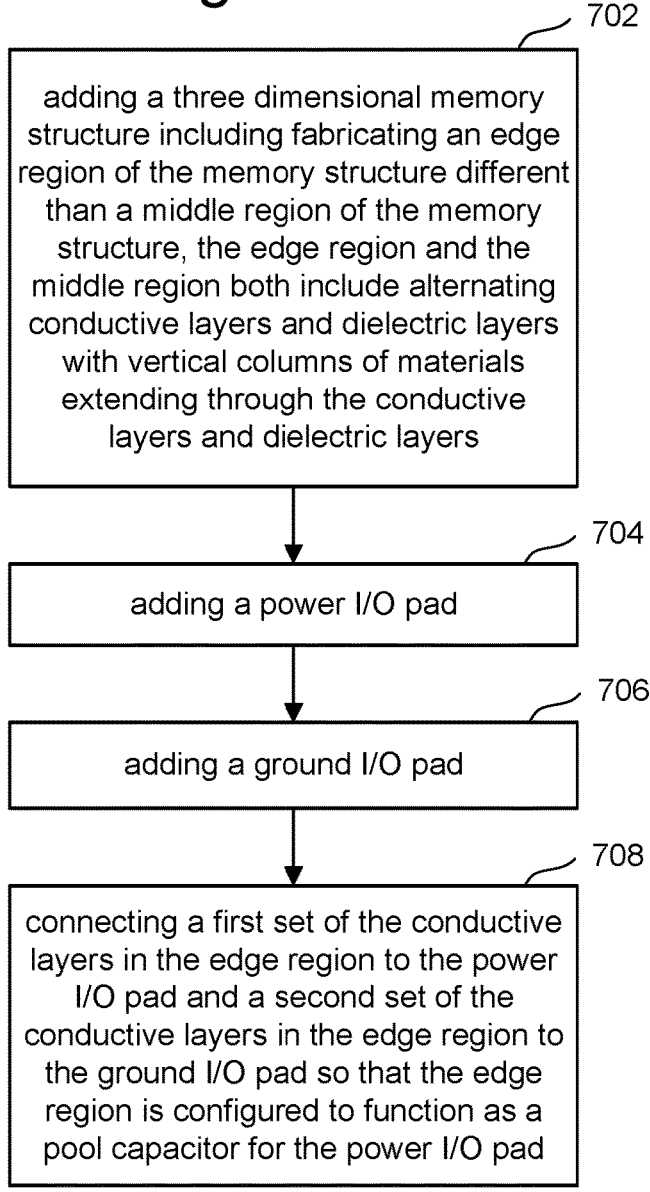
FIG. 10 is a flow chart describing a portion of one embodiment of a process for fabricating a memory die.

FIG. 10 is a flowchart describing a portion of one embodiment of a process for fabricating a memory die according to the embodiments discussed above that include using alternate word line layers to provide extra capacitance to the power I/O pad (e.g. VCCQ). In step 702, a three dimensional memory structure is added to the memory die, including fabricating an edge region (e.g., dummy block at edge of memory structure) of the memory structure different than a middle region (e.g., user data block away from the edge) of the memory structure. The edge region and the middle region (also known as an interior region) both include alternating conductive layers and dielectric layers with vertical columns of material extending through the conductive layers and the dielectric layers (as described above with respect to FIGS. 3A-3F). In step 704, a power I/O pad is added to the I/O interface. In step 706, ground I/O pad is added to the I/O interface. Other pads can also be added to the I/O interface. In step 708, a first set of the conductive layers in the edge region are connected to the power I/O pad and a second set of conductor layers in the edge region are connected to the ground I/O pad so that the edge region is configured to function as a pool capacitor for the power I/O pad.

Figure 11:
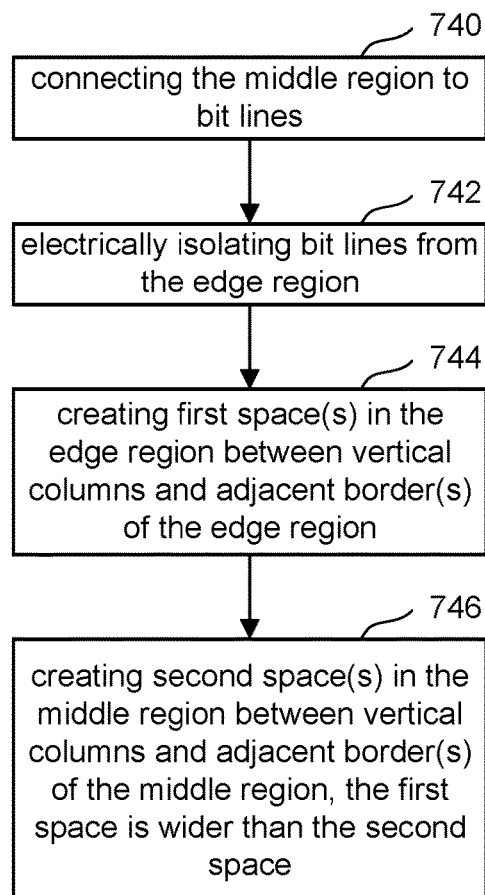
FIG. 11 is a flow chart describing a portion of one embodiment of a process for adding a three dimensional memory structure.

FIG. 11 is a flowchart describing a portion of one embodiment of a process that is performed as part of step 702 (in some embodiments). In step 740, the middle region of the three-dimensional memory structure that was added in step 702 is connected to the bit lines. In step 742, the edge region of the three-dimensional memory structure is electrically isolated from the bit lines. For example FIG. 7 shows no connection between the vertical column VC and the metal layer M1 for column 606. Alternatively, the bit lines can be patterned to not extend over the edge region. Step 744 includes creating first spaces in the edge region between the vertical columns and adjacent borders of the edge region. This includes creating gaps 570 of FIG. 6. Step 746 includes creating second spaces in the middle region between the vertical columns and adjacent borders of the middle region. This includes creating gaps 560 of FIG. 6. Note that the first spaces in the edge region is wider than the second spaces in the middle regions; for example, gap 570 is wider than gap 560.

Figure 12:
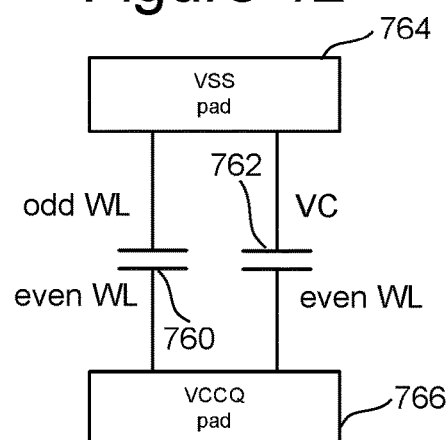
FIG. 12 is a symbolic schematic diagram showing a pool capacitor connected to the I/O interface.

FIG. 12 is a symbolic schematic diagram showing the pool capacitance added for VCCQ. FIG. 12 shows VSS pad 764 and VCCQ pad 766. The embodiment that only provides capacitance using word line layers includes capacitor 760 where one side of the capacitor is the even word lines and the other side of the capacitor is the odd word lines. The embodiment that also includes capacitance between the word lines and the vertical columns, includes capacitor 762. Once side of the capacitor 762 is the vertical columns and the other side of capacitor 762 is the even word lines.

Figure 13:
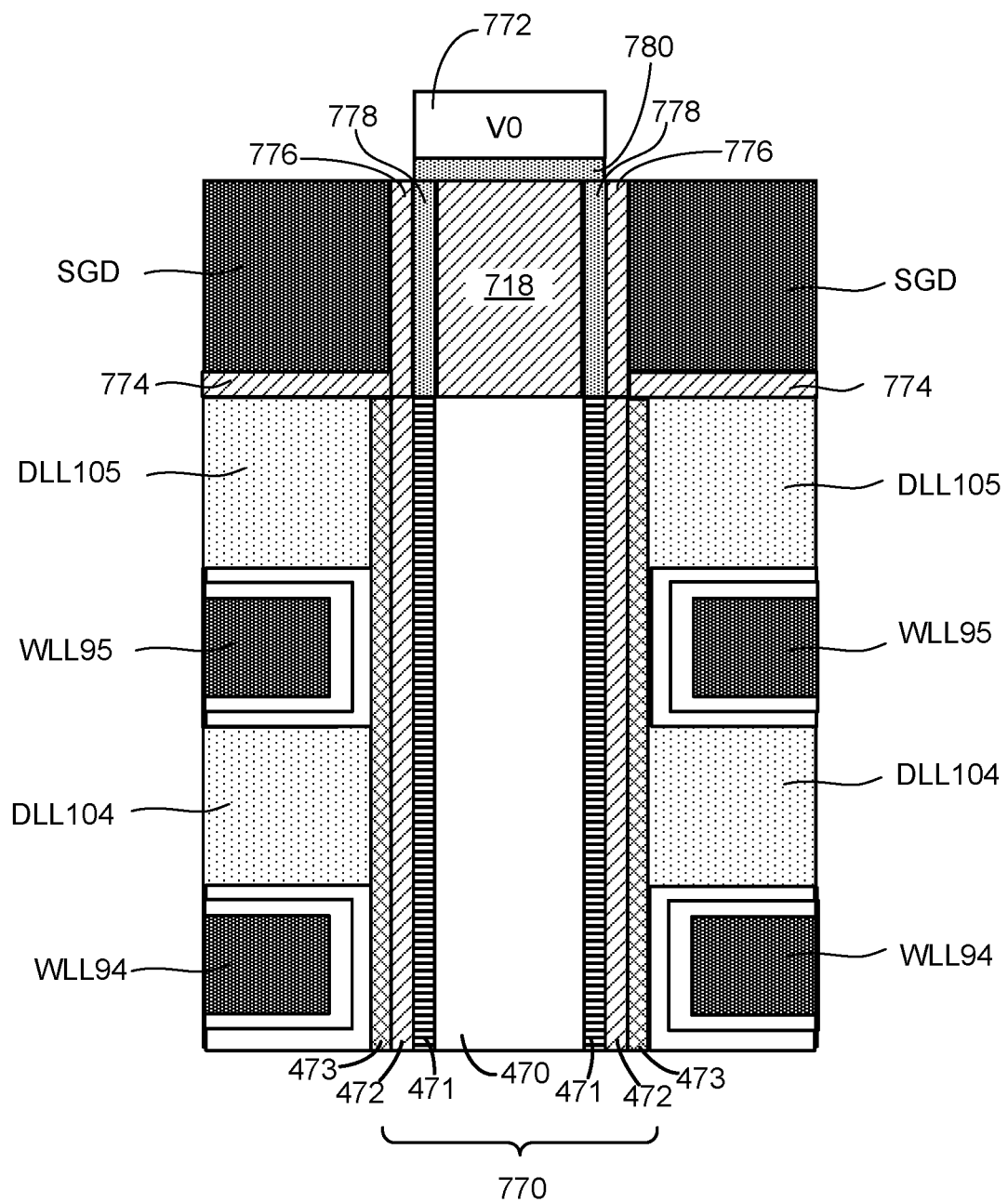
FIG. 13 is a cross sectional view of a vertical column of memory cells.

The memory structure of FIGS. 3A-3F includes vertical columns with four layers of drain side selection lines (SGD layers). In an alternative embodiment of the memory structure, the vertical columns will not include any layers of drain side selection lines (SGD layers). Thus, the SGD transistors will be separate from and on top of the vertical columns. For example, FIG. 13 shows an example of a top of vertical column 770. Above vertical column 770 is an SGD selection line. Directly above the vertical column 770 is a select gate that is controlled by the SGD line. The select gate is a transistor that can be turned on or off in order to connect the vertical column to a bit line through via 0. Below the SGD line and above the dielectric layer DLL105 is a dielectric 774 (e.g. SiO$_2$). Directly above the vertical column, and forming a hole in the SGD layer, is the select gate which is formed from polysilicon cylinder 778. Inside polysilicon cylinder 778 is dielectric 718. Outside polysilicon cylinder 778 is a dielectric cylinder 776 (e.g. SiO$_2$). When sufficient voltage is applied to the SGD line, polysilicon cylinder 778 is conductive and allows electrical communication between channel 471 of the vertical column and connector 778 which is physically contacting via V0 772.

In some embodiments of a memory structure according to FIG. 13, it is proposed to use the dummy block at the edge of the memory structure as a capacitor by using the SGD layer (metal) above the dummy block as the capacitor or part of the capacitor. In one embodiment, the bit lines are patterned as depicted in FIG. 8 so that they extend across all the blocks except the dummy block at the edge of the memory structure that is being used as a capacitor. Additionally, the SGD layer (labeled SGD in FIG. 13) is patterned so that it functions as a capacitor or as part of a capacitor. In another embodiment, the bit lines are patterned so that they extend across all the blocks including the dummy block at the edge of the memory structure that is being used as a capacitor.

Figure 14:
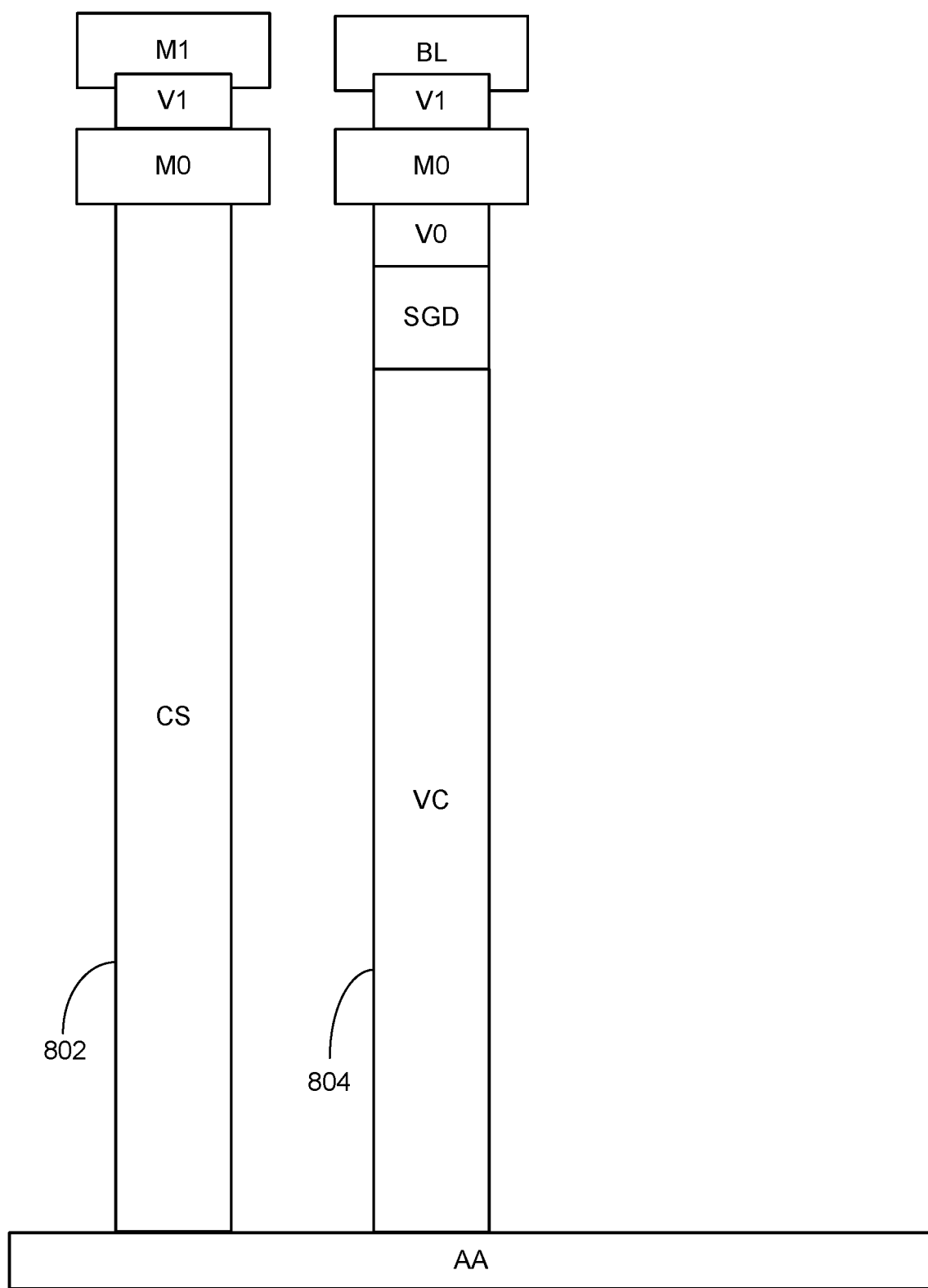
FIG. 14 depicts layers in one embodiment of a three dimensional memory structure.

FIG. 14 shows the various metal layers for the embodiment of FIG. 13. FIG. 14 shows active area AA with two columns: 802 and 804. Column 802 represents an area to the side of the memory structure (e.g., peripheral circuit 508) or an area in the memory structure between blocks. Column 804 refers to a vertical column in any of the blocks of the memory structure other than an edge block being used as a capacitor. As can be seen, the bit lines are implemented in the metal layer M1. Column 804 shows the vertical column on top of the active area AA. The SGD layers are adjacent and on top of the vertical column vc. Above the SGD layer is via V0 connecting the SGD layer to metal layer M0. Above the M0 layer is via V1 connecting metal layer M0 to the bit line. Column 802 includes a connection hole CS connecting the active area AA to the metal layer M0. Via V1 connects metal layer M0 to metal layer M1.

Figure 15:
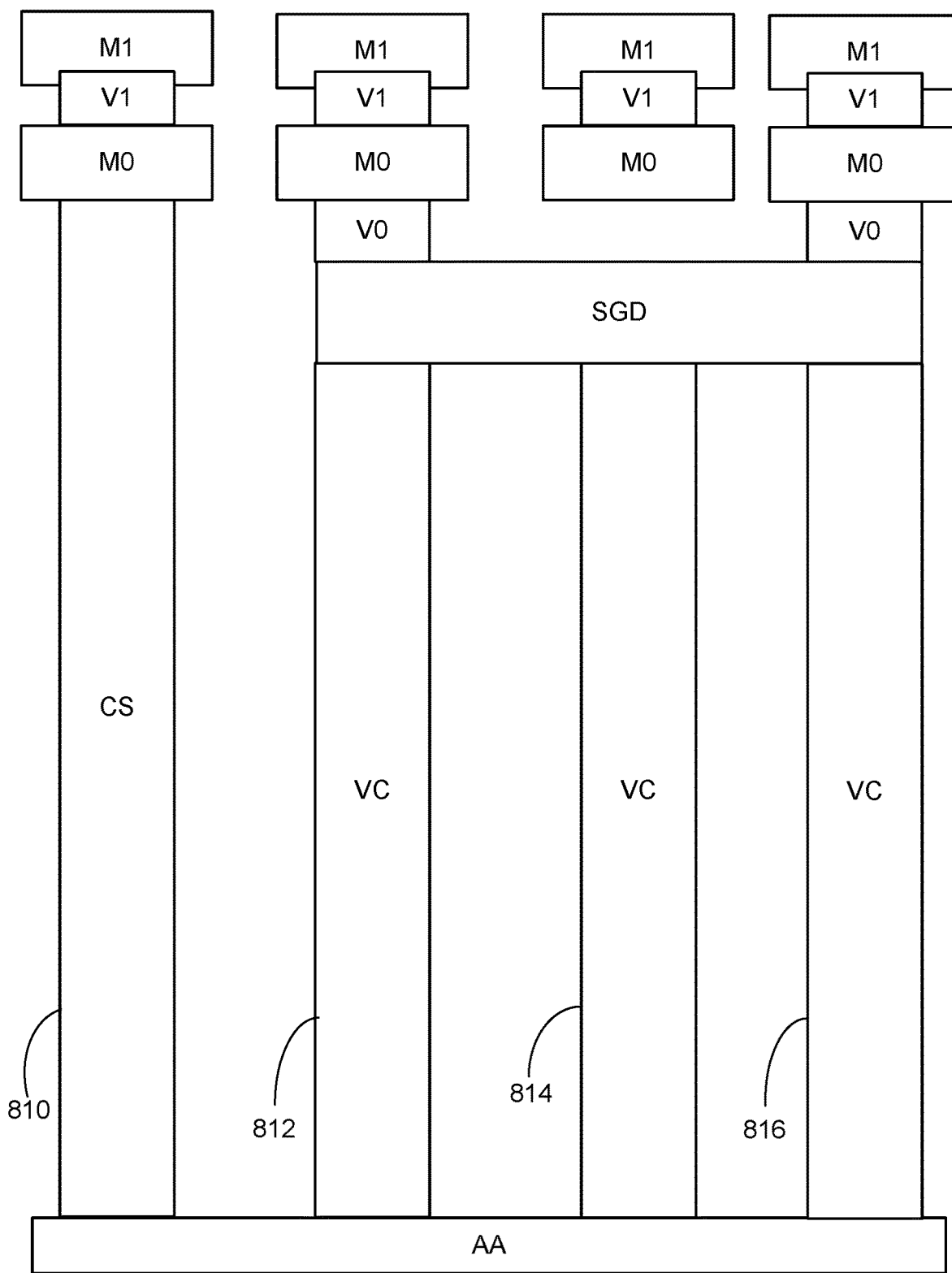
FIG. 15 depicts layers in one embodiment of a three dimensional memory structure.

FIG. 15 shows the metal layers when the dummy block at the edge of the memory structure is being used as a capacitor according to the embodiment of FIG. 13. FIG. 15 shows the active area AA below four columns: 810, 812, 814 and 816. Column 810 pertains to the peripheral circuit 508 or a connection area within the memory structure, and is the same as column 802 of FIG. 14. Columns 812, 814 and 816 are vertical columns in the dummy block (which is at the edge of the memory structure). Thus, the structure of columns 812, 814 and 816 are different than the structure of column 804 of FIG. 14. In one embodiment, the capacitor is created completely at the SGD layer. Therefore, FIG. 15 shows the SGD layer spanning across all of the vertical columns 812, 814 and 816. In one embodiment, the SGD layer would be patterned to one giant capacitor across the entire block. In other embodiments, the SGD layer can be patterned to multiple capacitors or sets of capacitors across a block. FIG. 15 shows all three vertical columns vc of columns 812, 814 and 816 connecting to the SGD layer, which is implementing the capacitor. One end of the SGD layer is connected to metal layer M1 through via V0, metal layer M0 and via V1. Similarly, another end of the SGD layer is connected to metal layer M1 through via V0, metal layer M0 and via V1. The two connections depicted in FIG. 15 include one of those connections going to VCCQ and one of the connections going to VSS.

Figure 16A:
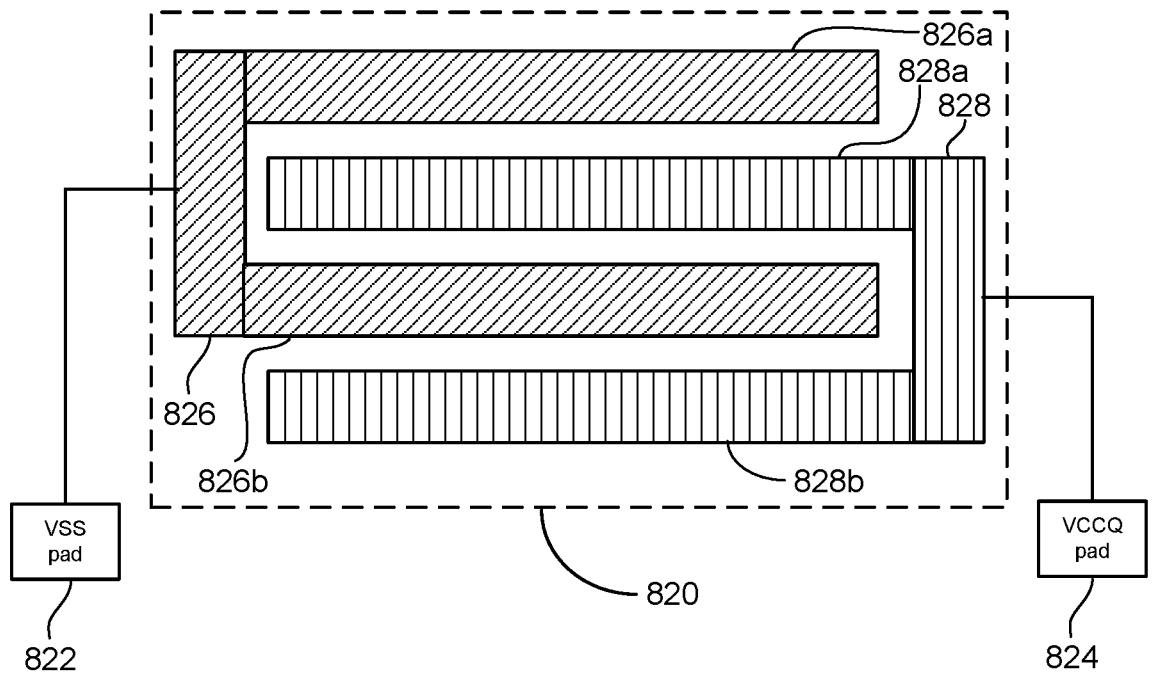
FIG. 16A depicts a top view of the selection line layer of the three dimensional memory structure functioning as a capacitor connected to the power I/O pad.

FIG. 16A is a top view of the SGD layer showing how all or a portion of the SGD layer can be patterned to form a capacitor. In one embodiment, the SGD layer is patterned into a set of interleaved combs having interdigitated fingers. For example, FIG. 16A shows a two interleaved combs 826 and 828. Comb 826 includes finger 826a and finger 826b. Comb 828 includes finger 828a and finger 828b. Fingers 828a and 828b are interleaved with fingers 826a and 826b to create interdigitated fingers. In one embodiment combs 826 and 828 are metal (and can be referred to as metal members). Comb 826 (with its interdigitated fingers 826a and 826b) is connected to VSS pad 822 (ground). Comb 828 (with its interdigitated fingers 828a and 828b) is connected to VCCQ pad 824 (power). The connection of comb 828 to VCCQ pad 824 is one of the connections shown in FIG. 15 from SGD through V0, M0, V1 and M1, and then down to the active area AA a column similar in structure to column 810. The connection of comb 826 to VSS pad 822 is the other connection depicted in FIG. 15 from SGD through V0, M0, V1 and M1, and then down to the active area AA by a column similar in structure to column 810.

Figure 16B:
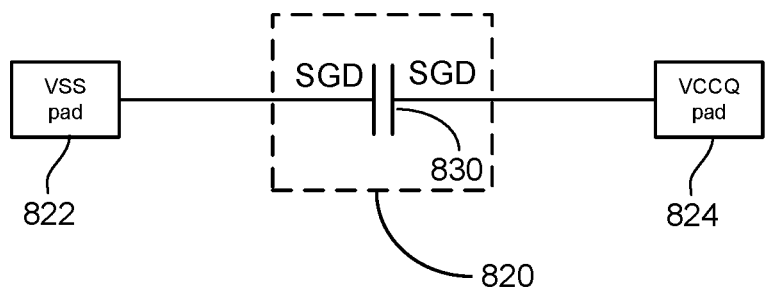
FIG. 16B is a symbolic schematic diagram showing a pool capacitor connected to the power I/O pad.

FIG. 16B is a symbolic schematic diagram depicting the capacitance provided by the embodiment of FIGS. 15 and 16A. FIG. 16B shows capacitor 820 connecting to VSS pad 822 and VCCQ pad 824. FIG. 16B shows logical capacitor 830 comprising capacitance between a portion of SGD layer and another portion of SGD layer.

Figure 17:
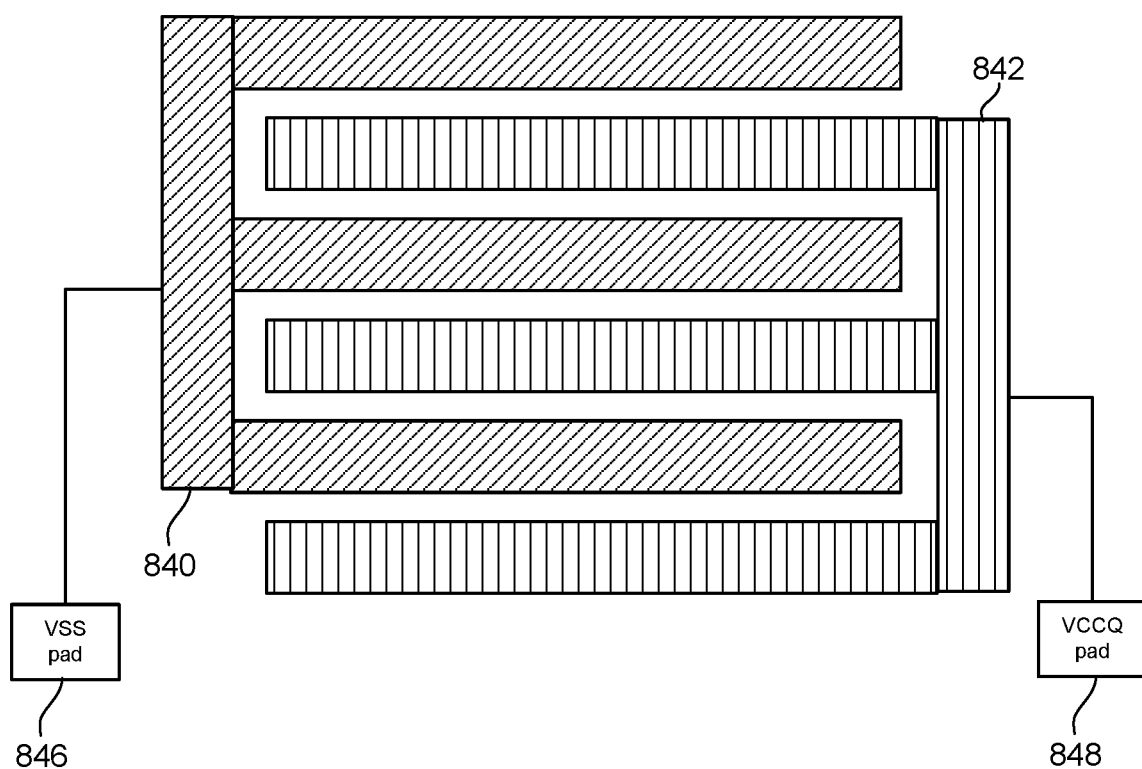
FIG. 17 depicts a top view of the selection line layer above the three dimensional memory structure functioning as a capacitor connected to the power I/O pad.

FIG. 17 depicts another embodiment for patterning the SGD layer. In this embodiment, the SGD layer is patterned into two interleaved combs such that the two combs form interdigitated fingers. For example, comb 840 is connected to VSS pad 846 and comb 842 is connected to VCCQ pad 848. Comb 840 is interleaved with comb 842 so that the two combs form interdigitated fingers. Both combs 840 and 842 are metal members on the same metal level. In one embodiment, the SGD layer of the dummy block at the edge of the memory structure includes one set of interleaved combs; however, in other embodiments the SGD layer includes multiple set of interleaved combs connect to VCCQ pad 848 and VSS pad 846. Thus, in the embodiment of FIGS. 16A, 16b and 17, the pool capacitor connected to VCCQ comprises at least two metal members on a common metal layer above the dummy block at the edge of the memory structure.

Figure 18:
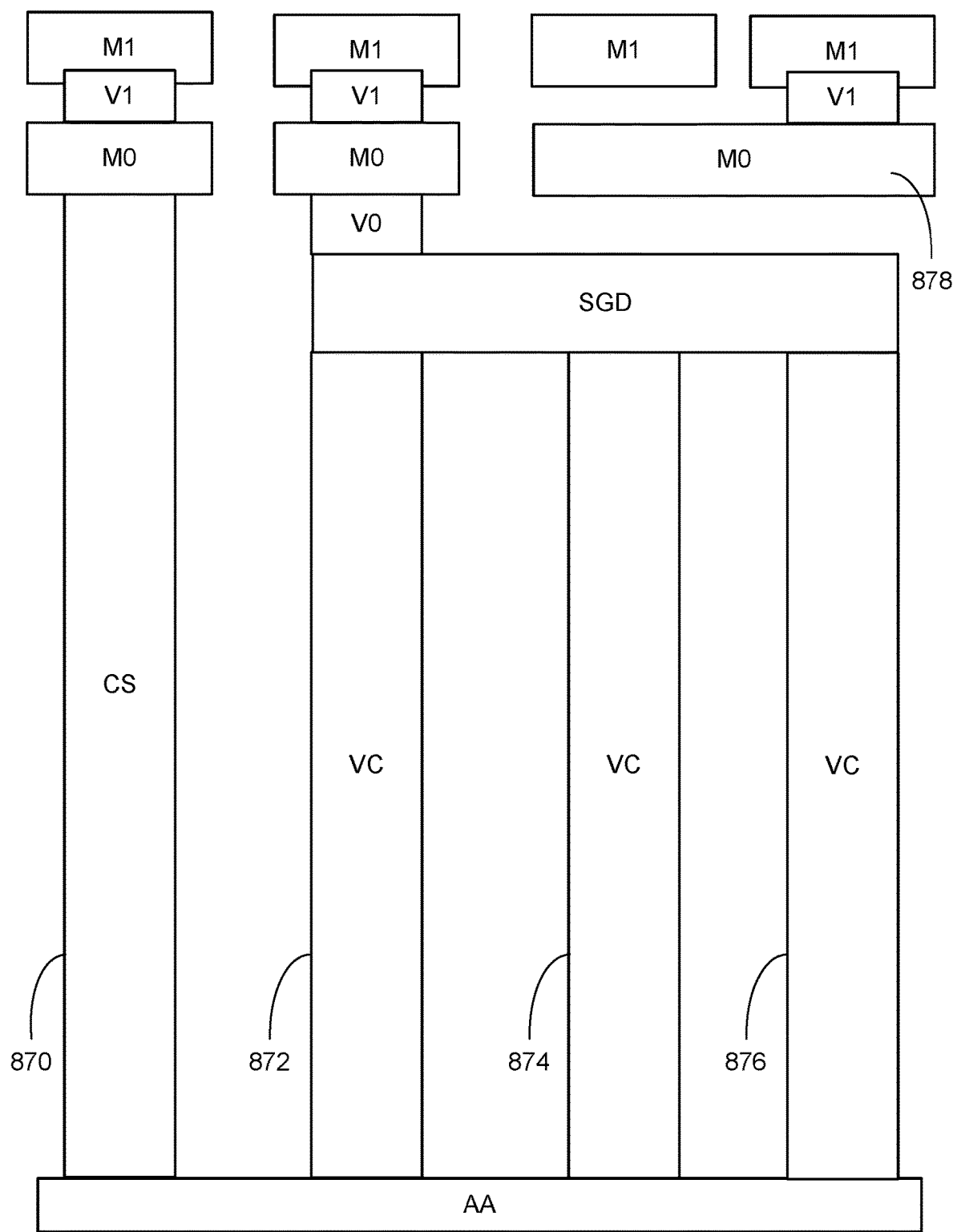
FIG. 18 depicts layers in one embodiment of a three dimensional memory structure.

In the embodiment of FIGS. 16A, 16B and 17, the pool capacitor is formed at the SGD layer. In another embodiment, the capacitor can be formed between the SGD layer and one of the metal layers such as metal layer M0 (or a different metal layer). For example, the capacitor may comprises a first metal member on a first metal layer above the dummy section and a second metal member on a second metal layer that is above the dummy section and above the first metal layer, where the first metal member is connected to the VCCQ pad and the second metal member is connected to the VSS pad. This embodiment is depicted in FIG. 18 which shows the various metal layers for four columns: 870, 872, 874 and 876. All four columns are implemented on top of active area AA. Column 870 is for peripheral circuit 508 or a connection region within the memory structure, and is analogous to column 810 of FIG. 15. Columns 872, 874 and 876 are for vertical columns in the dummy block at the edge of the memory structure. All three of columns 872, 874 and 876 include vertical columns VC positioned on top of the active area AA. Above the vertical columns VC of columns 872, 874 and 876 is the SGD layer which is patterned as explained herein. The SGD layer is connected to metal layer M1 through via V0, M0 and via V1. Once connected to metal layer M1, the signal is then routed back down another column (like column 870) to the active area where it is connected to the power I/O pad (e.g., VCCQ).

FIG. 18 also shows portion 878 of metal layer M0 which will is patterned in order to form a capacitor with the patterned SGD layer. That portion 878 of metal layer M0 will connect to metal layer M1 through via V1 and the signal will be routed to another column like column 870 to be brought down to the active area AA and connected to the ground I/O pad (e.g., VSS pad).

Figure 19A:
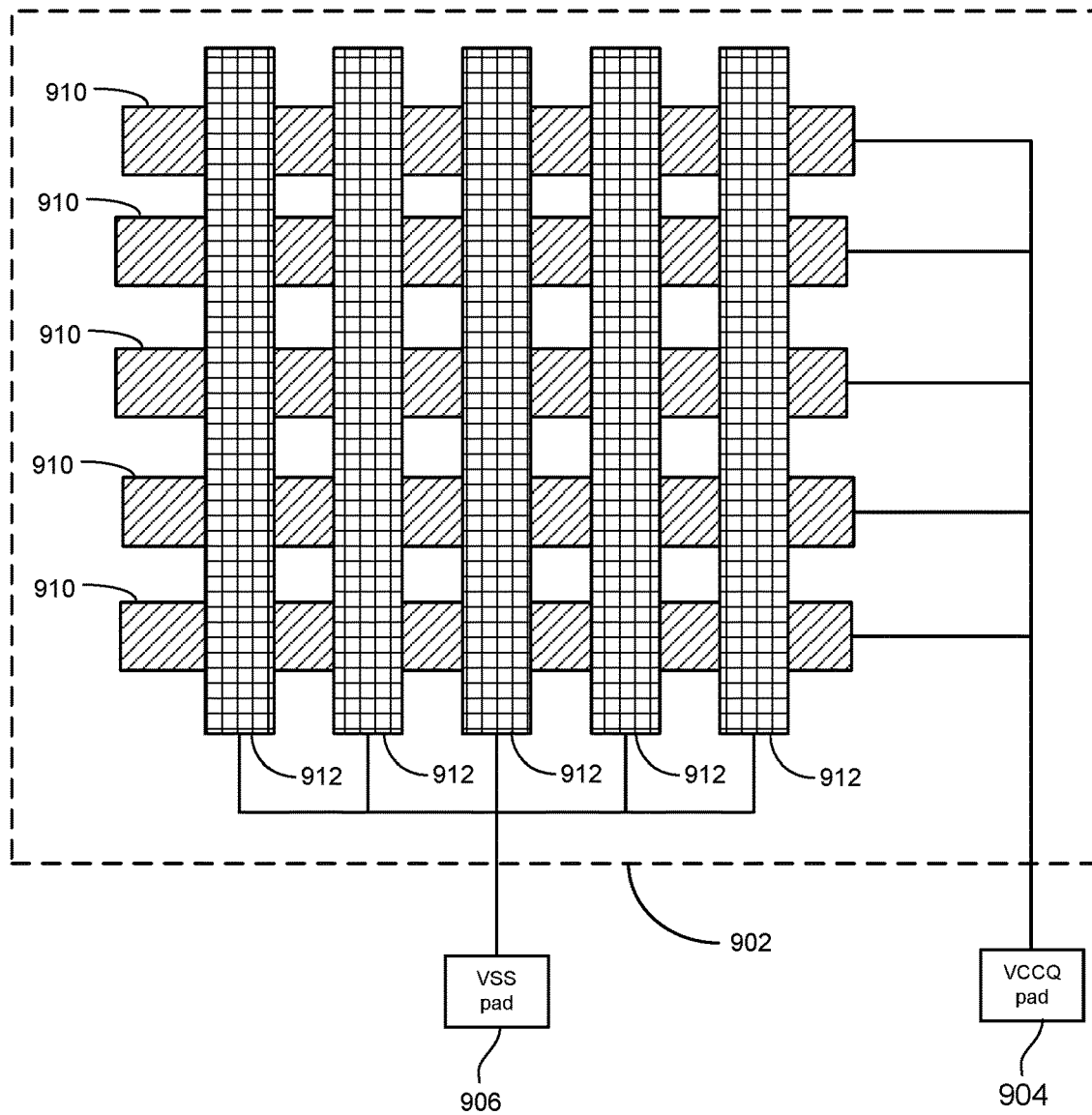
FIG. 19A depicts a top view of layers above the three dimensional memory structure functioning as a capacitor connected to the power I/O pad.

FIG. 19A depicts one example of patterning the SGD layer and the M0 metal layer to create the capacitor. The SGD layer is patterned into a set of strips 910 all of which are connected to VCCQ pad 904. Metal layer M0 is patterned into strips 912 which are orthogonal to strips 910. Strips 912 are all connected to VSS pad 906. In one embodiment, the SGD layer is made of Tungsten; however, other materials (including other metals) can also be used.

Figure 19B:
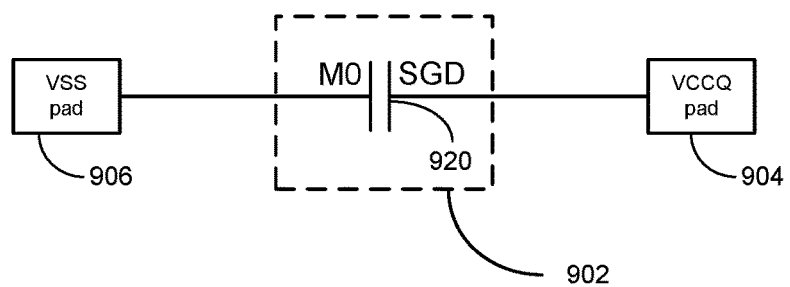
FIG. 19B is a symbolic schematic diagram showing a pool capacitor connected to the power I/O pad.

FIG. 19B is a symbolic schematic drawing showing pool capacitor 902 connected to VCCQ pad 904 and VSS pad 906. FIG. 19B shows the pool capacitance 902 and includes M0 and SGD forming providing the pool capacitance 920.

Figure 20A:
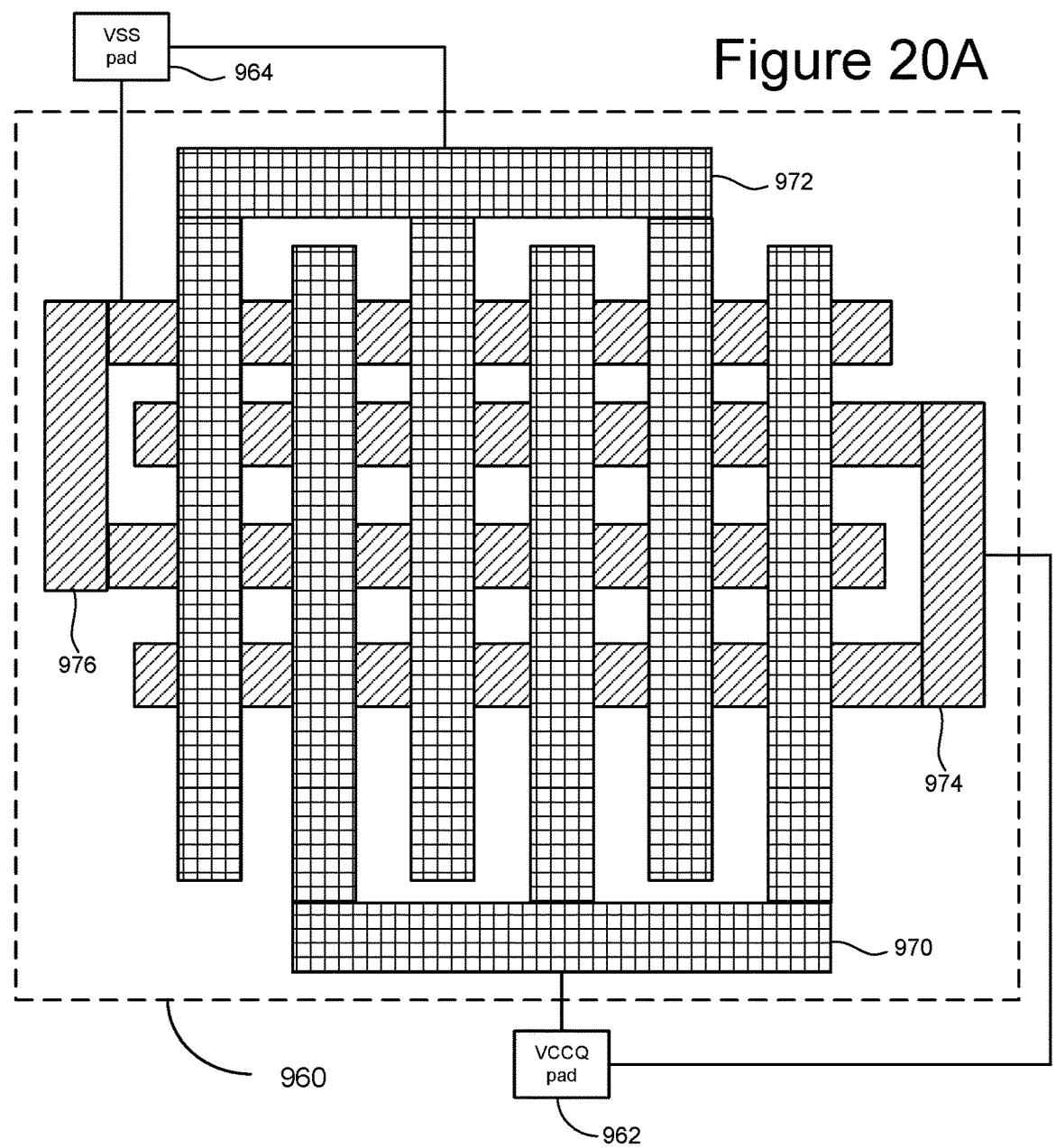
FIG. 20A depicts a top view of layers above the three dimensional memory structure functioning as a capacitor connected to the power I/O pad.

FIG. 20A shows another example of patterning the SGD layer and M0 layer. In this embodiment, the SGD layer and the M0 layer are patterned into interleaved combs having interdigitated fingers. That is, on each layer (SGD and M0) there is at least one pair of interleaved combs in the form interdigitated fingers. For example, the SGD layer includes interdigitated fingers 974 interleaved with interdigitated fingers 976. Interdigitated fingers 974 are connected to VCCQ pad 962 and interdigitated fingers 976 are connected to VSS pad 964. The M0 layer is patterned into interdigitated fingers 972 connected to VSS pad 964 and interdigitated fingers 970 connected to VCCQ pad 962. The embodiment of FIG. 28 requires four connections, two to VCCQ pad 962 and two to VSS pad 964, all of which will be implemented by four connections to the M1 layer and then down from the M1 layer down to the active area AA via a column like 870 of FIG. 18. In some embodiment, each SGD layer and each M) layer will have multiple sets of capacitors 960.

Figure 20B:
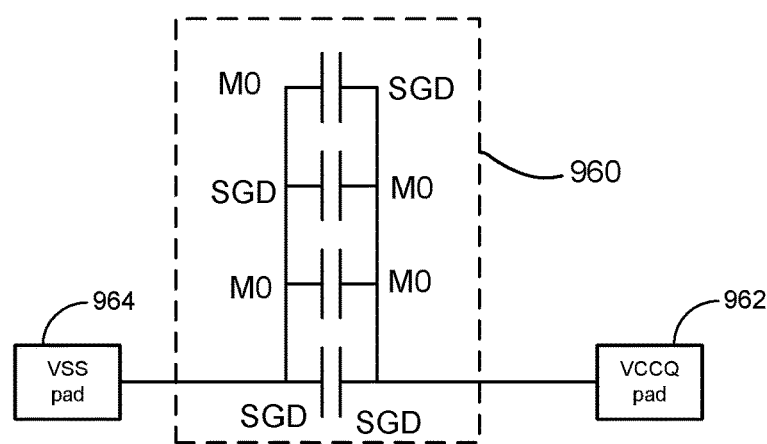
FIG. 20B is a symbolic schematic diagram showing a pool capacitor connected to the power I/O pad.

FIG. 20B is a logical schematic diagram showing capacitance provided by the embodiment of FIG. 20A. That is, FIG. 20B shows pool capacitor 960 connected to VCCQ pad 962 and VSS pad 964 of the I/O interface discussed above. Pool capacitance 960 includes four sources of capacitance. One logical capacitor is between parts of the SGD layer (974-976). The second logical capacitor is between portions of the M0 layer (970-972). The third logical capacitance is between a portion of the SGD layer and a portion of the M0 layer (976-970). A fourth logical capacitor is between a portion of the M0 layer and the SGD layer (972-974).

FIG. 21 is a flowchart describing a portion of one embodiment of a process of fabricating a memory die. For example, all or a portion of the process of FIG. 21 can be performed to fabricate a memory die having one or more pool capacitors in the form of FIGS. 16A, 17, 19A and 20A. The process of FIG. 21 is only a subset of the manufacturing process and represents steps than be carried out in addition to the standard process.

In step 980, the power I/O pad and ground I/O pad are added to the I/O interface. Other pads can also be added. In step 982, three-dimensional memory structure is fabricated. That three-dimensional memory structure includes alternating conductive layers and dielectric layers with vertical columns of materials extending through the conductive layers and dielectric layers, such as described above with respect to FIG. 13. In step 984, a first metal layer above the three-dimensional memory structure is added. For example, the SGD layer can be added. In step 986, a first portion of the first metal layer over the middle section of the memory structure is formed as a select gate for the middle section. That is, the select gates depicted in FIG. 13 is created over the vertical columns in the user data blocks that are in the interior or middle part of the plane of the memory structure. In step 988, a second portion of the metal layer over an edge section of the memory structure is used to form at least a portion of one or more capacitors. Alternatively, an entire capacitor can be created. Thus, step 988 includes creating a pattern as described above (see e.g. FIGS. 16A, 17 and 19A and 20A). In step 990, a second metal layer is added above the first metal layer. For example, metal layer M0 is added. In step 992, a first middle member on the second metal layer above the edge section is created. In step 994, a second middle member on the second metal layer above the edge section is created. For example, steps 992 and 994 can include creating interleaved combs 970 and 972. Other shapes can also be created. Additionally, the pattern of FIG. 19A can be created. In step 996, the one or more capacitors created in the steps 980-984 are connected to the power I/O pad and the ground I/O pad. In one alternative, step 988 further includes step 988*a* of creating a third middle member on the first metal layer above the edge section and creating a fourth middle member on the first metal layer above the edge section. For example, step 988*a* can include creating interleaved combs 974 and 976 of FIG. 20A or the strips 910 of FIG. 19A. The third middle member would be connected to the power I/O pad and the fourth middle member is connected to the ground I/O pad.

In one embodiment, steps 980-996 (including step 988*a*) of FIG. 21 are performed to fabricate a memory die having one or more pool capacitors in the form of FIG. 20A. In this embodiment, the connecting the one or more capacitors to the power I/O pad and the ground I/O pad comprises connecting the first metal member to the power I/O pin, connecting the second metal member to the ground I/O pin, connecting the third metal member to the power I/O pin, and connecting the fourth metal member to the ground I/O pin.

In one embodiment, steps 980-996 of FIG. 21 are performed to fabricate a memory die having one or more pool capacitors in the form of FIG. 19A. In this embodiment, the connecting the one or more capacitors to the power I/O pad and the ground I/O pad comprises connecting the first metal member to the ground I/O pin, connecting the second metal member to the ground I/O pin, connecting the third metal member to the power I/O pin, and connecting the fourth metal member to the power I/O pin.

In one embodiment, steps 980-988 (including step 988*a*) and 996 of FIG. 21 are performed to fabricate a memory die having one or more pool capacitors in the form of FIG. 16A or FIG. 17. In this embodiment, the connecting the one or more capacitors to the power I/O pad and the ground I/O pad comprises connecting the third metal member to the power I/O pin and connecting the fourth metal member to the ground I/O pin.

One embodiment includes a non-volatile storage apparatus comprising a non-volatile memory structure, a peripheral circuit connected to the memory structure, and an I/O interface connected to the peripheral circuit. A section of the memory structure is configured to operate as a capacitor and is connected to the I/O interface.

One embodiment includes a non-volatile storage apparatus comprising a memory die comprising a three dimensional memory structure, a power I/O pad, and a ground I/O pad. The memory structure comprises alternating conductive layers and dielectric layers with vertical columns of materials extending through the conductive layers and dielectric layers. A section of the memory structure that includes multiple vertical columns has a first set of the conductive layers connected to the power I/O pad and a second set of the conductive layers connected to ground I/O pad such that the section of the memory structure functions as a capacitor connected to the power I/O pad, the first set of the conductive layers are interleaved with the second set of the conductive layers.

One embodiment includes a method comprising adding a three dimensional memory structure including fabricating an edge region of the memory structure different than an interior region of the memory structure, the edge region and the interior region both include alternating conductive layers and dielectric layers with vertical columns of materials extending through the conductive layers and dielectric layers; adding a power I/O pad and a ground I/O pad; and connecting a first set of the conductive layers in the edge region to the power I/O pad and a second set of the conductive layers in the edge region to the ground I/O pad so that the edge region is configured to function as a pool capacitor for the power I/O pad.

One embodiment includes a non-volatile storage apparatus comprising a memory die. The memory die comprises a power I/O pad, a ground I/O pad, and a three dimensional memory array. The three dimensional memory array comprises a plurality of blocks of memory cells. A dummy block of the blocks of memory cells that is positioned at an edge of the memory array is connected to the power I/O pad and the ground I/O pad. The dummy block includes means for functioning as a capacitor connected to the power I/O pad.

One embodiment includes a non-volatile storage apparatus, comprising a three dimensional non-volatile memory structure including a user data section and a dummy section, a capacitor positioned above the dummy section, and an I/O interface connected to the capacitor.

One embodiment includes a non-volatile storage apparatus, comprising a three dimensional non-volatile memory structure, a first metal layer positioned above the memory structure, a peripheral circuit connected to the memory structure, and an I/O interface connected to the peripheral circuit. A first portion of the first metal layer is positioned over a first section of the memory structure and is configured to function as select gates for connecting the first section of the memory structure to the peripheral circuit. A second portion of the first metal layer is positioned over a second section of the memory structure, configured to function as a capacitor and is connected to the I/O interface.

One embodiment includes a non-volatile storage apparatus, comprising a memory die comprising a three dimensional memory structure, a first metal layer, and a first I/O pad. The memory structure comprises alternating conductive layers and dielectric layers with vertical columns of materials extending through the conductive layers and dielectric layers. A first portion of the first metal layer is positioned above a middle section of the memory structure and is configured to function as select gates for middle section. A second portion of the first metal layer is positioned above an edge section of the memory structure, configured to operate as a capacitor and is connected to the first I/O pad, the second portion of the first metal layer is positioned over multiple vertical columns of the edge section.

One embodiment includes a method, comprising adding a power I/O pad and a ground I/O pad; fabricating a three dimensional memory structure that includes alternating conductive layers and dielectric layers with vertical columns of materials extending through the conductive layers and dielectric layers; adding a first metal layer above the three dimensional memory structure; forming a first portion of the first metal layer over a middle section of the memory structure as select gates for middle section; forming a second portion of the first metal layer over an edge section of the memory structure as at least a portion of one or more capacitors; and connecting the one or more capacitors to the power I/O pad and the ground I/O pad.

Means for means for functioning as a capacitor connected to the power I/O pad can include one or more pool capacitors in the form of the connected word lines of FIG. 5 and the structure of FIG. 9 that also includes the vertical columns being connected to ground.

For purposes of this document, I/O can refer to input only, output only, or both input and output.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
    a non-volatile memory array configured to store data;
    a peripheral circuit that is separate from and connected to the memory array; and
    an I/O interface connected to the peripheral circuit, the I/O interface includes a power I/O pad and a ground I/O pad, a section of the non-volatile memory array is configured to operate as a capacitor for the power I/O pad and is connected to the power I/O pad and the ground I/O pad.

2. The non-volatile storage apparatus of claim 1, wherein:
    the non-volatile memory structure is a three dimensional non-volatile memory array divided into blocks; and
    the section of the memory array is a block at an edge of the memory array that is configured to operate as the capacitor.

3. The non-volatile storage apparatus of claim 1, wherein:
    the non-volatile memory array is a three dimensional memory array comprising alternating conductive layers and dielectric layers with vertical columns of materials extending through the conductive layers and dielectric layers; and
    the section of the memory structure includes multiple vertical columns, has a first set of the conductive layers connected to the power I/O pad and a second set of the conductive layers connected to ground I/O pad such that the section of the memory structure functions as the capacitor connected to the power I/O pad.

4. The non-volatile storage apparatus of claim 3, further comprising:
    a first switch connected to the power I/O pad, the first set of the conductive layers are connected to the first switch; and
    a second switch connected to the ground I/O pad, the second set of the conductive layers are connected to the second switch.

5. The non-volatile storage apparatus of claim 3, further comprising:
    a first switch connected to the power I/O pad and connected to a first end of the first set of the conductive layers;
    a second switch connected to the power I/O pad and connected to a second end of the first set of the conductive layers;
    a third switch connected to the ground I/O pad and connected to a first end of the second set of the conductive layers; and
    a fourth switch connected to the ground I/O pad and connected to a second end of the second set of the conductive layers.

6. The non-volatile storage apparatus of claim 1, further comprising:
    bit lines, the section of the memory structure is a first section at an edge of the memory array, the non-volatile memory structure further includes a second section away from the edge of the memory structure, the bit lines connect to the second section, the bit lines extend over the first section but do not connect to the first section.

7. The non-volatile storage apparatus of claim 1, further comprising:
    bit lines, the section of the memory structure is a first section at an edge of the memory array that is configured to operate as the capacitor, the non-volatile memory array further includes a second section away from the edge of the memory structure, the bit lines extend over and connect to the second section, the bit lines are arranged in a direction to extend over the first section but do not extend over the first section.

8. The non-volatile storage apparatus of claim 1, wherein:
    the non-volatile memory array is a three dimensional memory array comprising a plurality of conductive layers with vertical columns of materials extending through the conductive layers; and
    the section of the memory structure includes multiple vertical columns, has a first set of the conductive layers are connected to the power I/O pad and a second set of the conductive layers are connected to the ground I/O pad.

9. The non-volatile storage apparatus of claim 8, wherein:
    the non-volatile memory array divided into blocks;
    the section of the memory array is a dummy block at an edge of the memory array that is configured to operate as a capacitor and is connected to the I/O interface; the memory array further includes a user data block in an interior section of the memory array;
    the dummy block at the edge of the memory array includes a first gap between vertical columns and an adjacent border of the block at the edge of the memory array; and
    the user data block in the interior section of the memory array includes a second gap between vertical columns and an adjacent border of the block in the interior section of the memory array, the first gap is wider than the second gap.

10. The non-volatile storage apparatus of claim 8, wherein:
    the multiple vertical columns of the section of the memory array are connected to ground so that the vertical columns in combination with the first set of the conductive layers provide capacitance to the power I/O pad.

11. The non-volatile storage apparatus of claim 10, wherein:
the multiple vertical columns of the section of the memory array are connected to ground via source side select gates and a cell source connection.

12. The non-volatile storage apparatus of claim 10, wherein:
the multiple vertical columns of the section of the memory array are connected to ground via drain side select gates and a metal layer positioned above the multiple vertical columns.

13. The non-volatile storage apparatus of claim 10, further comprising:
bit lines, the section of the memory array is a first section at an edge of the memory array, the non-volatile memory array further includes a second section away from the edge of the memory array, the bit lines extend over and connect to the second section, the bit lines are arranged in a direction to extend over the first section but do not extend over the first section.

14. The non-volatile storage apparatus of claim 1, wherein:
the non-volatile memory array is a three dimensional memory array comprising a plurality of conductive layers with vertical columns of materials extending through the conductive layers;
the section of the memory structure includes multiple vertical columns and has a set of the conductive layers connected to the I/O interface; and
the multiple vertical columns of the section of the memory structure are connected to the ground I/O pad so that the vertical columns in combination with the set of the conductive layers provide capacitance to the power I/O pad.

15. A non-volatile storage apparatus, comprising:
a memory die comprising a three dimensional non-volatile memory array configured to store data, a power I/O pad, and a ground I/O pad;
the three dimensional non-volatile memory array comprises alternating conductive layers and dielectric layers with vertical columns of materials extending through the conductive layers and dielectric layers;
a section of the three dimensional non-volatile memory array that includes multiple vertical columns has a first set of the conductive layers connected to the power I/O pad and a second set of the conductive layers connected to ground I/O pad such that the section of the memory structure functions as a plurality of pool capacitors connected to and providing pool capacitance for the power I/O pad, the first set of the conductive layers are interleaved with the second set of the conductive layers.

16. The non-volatile storage apparatus of claim 15, wherein:
the section of the three dimensional non-volatile memory array is a block at an edge of the three dimensional non-volatile memory array that is configured to operate as a capacitor connected to the power I/O pad.

17. The non-volatile storage apparatus of claim 16, wherein:
the multiple vertical columns of the section of the three dimensional non-volatile memory array are connected to ground so that the vertical columns in combination with the first set of the conductive layers provide capacitance to the power I/O pad.

18. A method, comprising:
adding a three dimensional non-volatile memory structure that is configured to store data including fabricating a memory array that comprises an edge region and an interior region, the edge region of the memory array is adjacent to the interior region of the memory array, the edge region and the interior region both include alternating conductive layers and dielectric layers with vertical columns of materials extending through the conductive layers and dielectric layers;
adding a power I/O pad and a ground I/O pad; and
connecting a first set of the conductive layers in the edge region to the power I/O pad and a second set of the conductive layers in the edge region to the ground I/O pad so that the edge region is configured to function as a pool capacitor for the power I/O pad.

19. The method of claim 18, wherein:
the edge region is a dummy block of memory cells at an edge of the memory array; and
the interior region is a block of memory cells away from the edge of the memory array.

20. The method of claim 18, wherein the fabricating the memory array includes adding the edge region that is different than the interior region, comprising:
connecting the interior region to bit lines;
electrically isolating bit lines from the edge region;
creating a first space in the edge region between vertical columns and an adjacent border of the edge region; and
creating a second space in the interior region between vertical columns and an adjacent border of the interior region, the first space is wider than the second space.

* * * * *